US008736402B2

(12) United States Patent
Takamine

(10) Patent No.: US 8,736,402 B2
(45) Date of Patent: May 27, 2014

(54) ELASTIC WAVE FILTER DEVICE WITH IDT ELECTRODES THAT INCLUDE A NARROWER-PITCH PORTION

(75) Inventor: Yuichi Takamine, Ishikawa-gun (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 599 days.

(21) Appl. No.: 13/045,587

(22) Filed: Mar. 11, 2011

(65) Prior Publication Data

US 2011/0156842 A1 Jun. 30, 2011

Related U.S. Application Data

(63) Continuation of application No. PCT/JP2009/002912, filed on Jun. 25, 2009.

(30) Foreign Application Priority Data

Sep. 24, 2008 (JP) ................................. 2008-244506

(51) Int. Cl.
| | |
|---|---|
| *H03H 9/64* | (2006.01) |
| *H03H 9/145* | (2006.01) |
| *H03H 9/02* | (2006.01) |
| *H03H 9/00* | (2006.01) |

(52) U.S. Cl.
CPC ......... *H03H 9/14582* (2013.01); *H03H 9/6433* (2013.01); *H03H 9/02535* (2013.01); *H03H 9/0071* (2013.01)
USPC ......... 333/193; 333/195; 333/196; 310/313 B

(58) Field of Classification Search
USPC ...................... 333/133, 193–196; 310/313 B
See application file for complete search history.

(56) References Cited

U.S. PATENT DOCUMENTS

| | | | |
|---|---|---|---|
| 6,420,946 B1 | 7/2002 | Bauer et al. | |
| 8,339,221 B2 * | 12/2012 | Takamine | ..................... 333/195 |

(Continued)

FOREIGN PATENT DOCUMENTS

| | | |
|---|---|---|
| EP | 1 158 672 A2 | 11/2001 |
| JP | 04-054011 A | 2/1992 |

(Continued)

OTHER PUBLICATIONS

English translation of Official Communication issued in corresponding German Patent Application No. 11 2009 002 361.4, mailed on Mar. 15, 2013.

(Continued)

*Primary Examiner* — Barbara Summons
(74) *Attorney, Agent, or Firm* — Keating & Bennett, LLP

(57) ABSTRACT

An elastic wave filter device having improved sharpness of filter characteristics includes a longitudinally-coupled resonator-type elastic wave filter section including first to third IDT electrodes each including a plurality of electrode fingers, and first and second reflectors. The first to third IDT electrodes include narrower-pitch portions provided in end portions thereof, which are each adjacent to another IDT electrode in a direction of propagation of elastic waves, each of the narrower-pitch portions having a smaller period of electrode fingers than a period of electrode fingers in the remaining portion of the relevant IDT electrode. The number of electrode fingers in the narrower-pitch portion of the second IDT electrode, which is disposed on the side closer to the first IDT electrode, and the number of electrode fingers in the narrower-pitch portion of the second IDT electrode, which is disposed on the side closer to the third IDT electrode, differ from each other.

11 Claims, 13 Drawing Sheets

(56) References Cited

U.S. PATENT DOCUMENTS

| | | | |
|---|---|---|---|
| 2002/0000898 A1 | 1/2002 | Takamine | |
| 2002/0017969 A1* | 2/2002 | Takamine | 333/193 |
| 2004/0201435 A1* | 10/2004 | Ouchi et al. | 333/195 |
| 2004/0222870 A1 | 11/2004 | Ueda et al. | |
| 2007/0024397 A1* | 2/2007 | Otsuka et al. | 333/195 |
| 2007/0152778 A1* | 7/2007 | Takamine | 333/195 |
| 2007/0229194 A1* | 10/2007 | Takamine | 333/195 |
| 2009/0160574 A1 | 6/2009 | Yamane et al. | |

FOREIGN PATENT DOCUMENTS

| | | |
|---|---|---|
| JP | 2002-084163 A | 3/2002 |
| JP | 2002-528987 A | 9/2002 |
| JP | 2003-243965 A | 8/2003 |
| JP | 2006-254410 A | 9/2006 |
| WO | 00/25423 A1 | 5/2000 |
| WO | 2008/038502 A1 | 4/2008 |

OTHER PUBLICATIONS

Official Communication issued in International Patent Application No. PCT/JP2009/002912, mailed on Aug. 25, 2009.

Official Communication issued in corresponding Japanese Patent Application No. 2009-547483, mailed on Mar. 23, 2010.

Takamine, "Elastic Wave Filter Device," U.S. Appl. No. 13/044,647, filed Mar. 10, 2011.

* cited by examiner

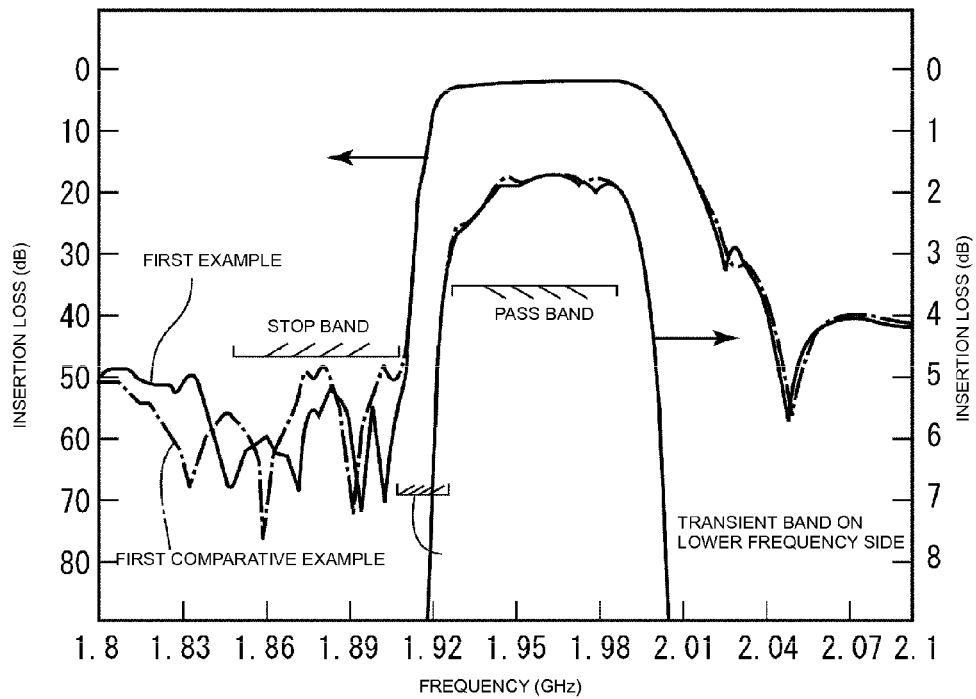
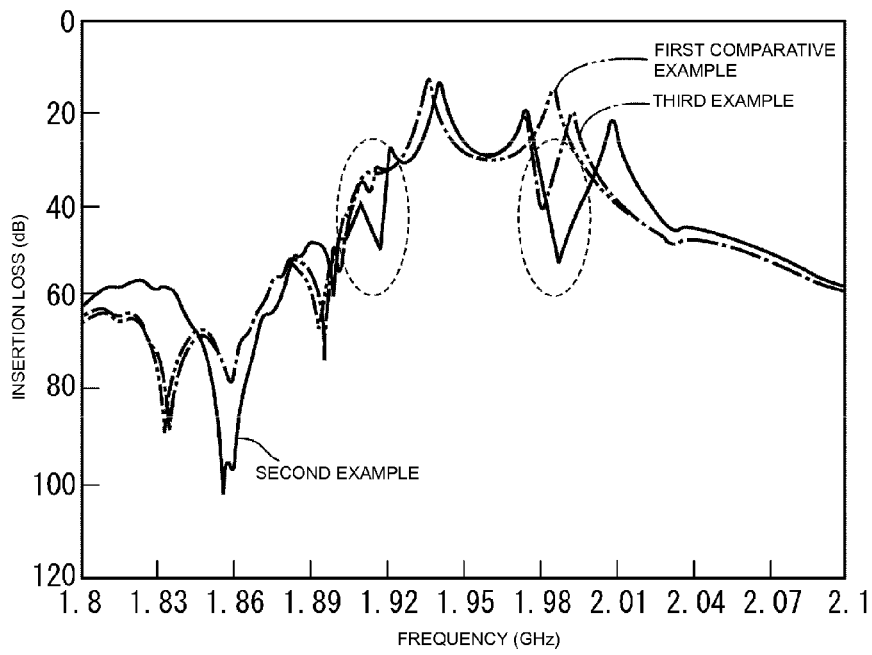

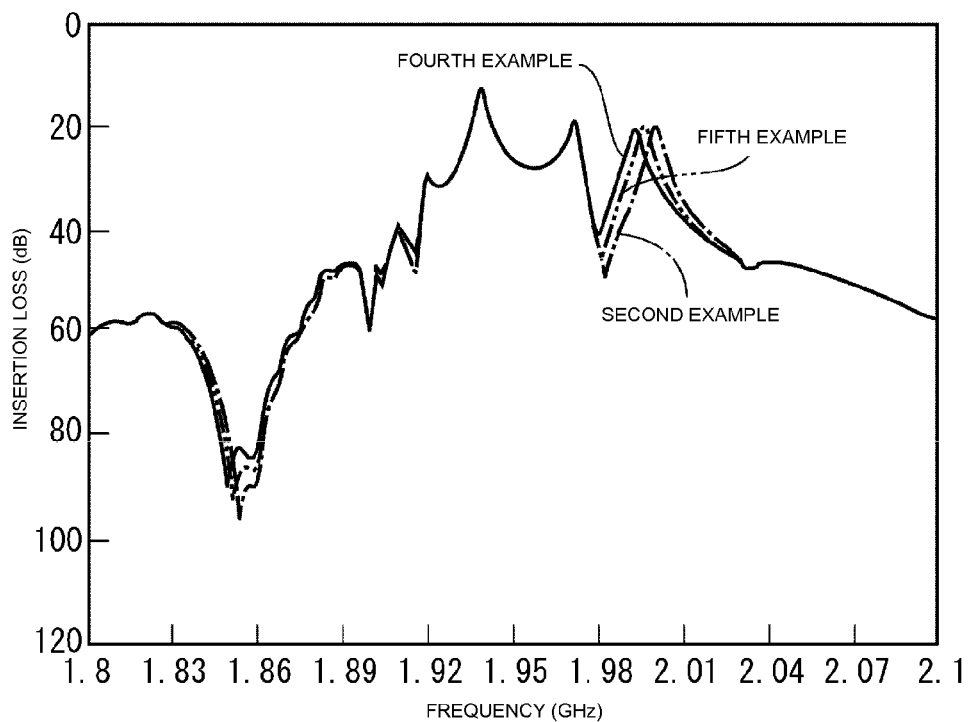

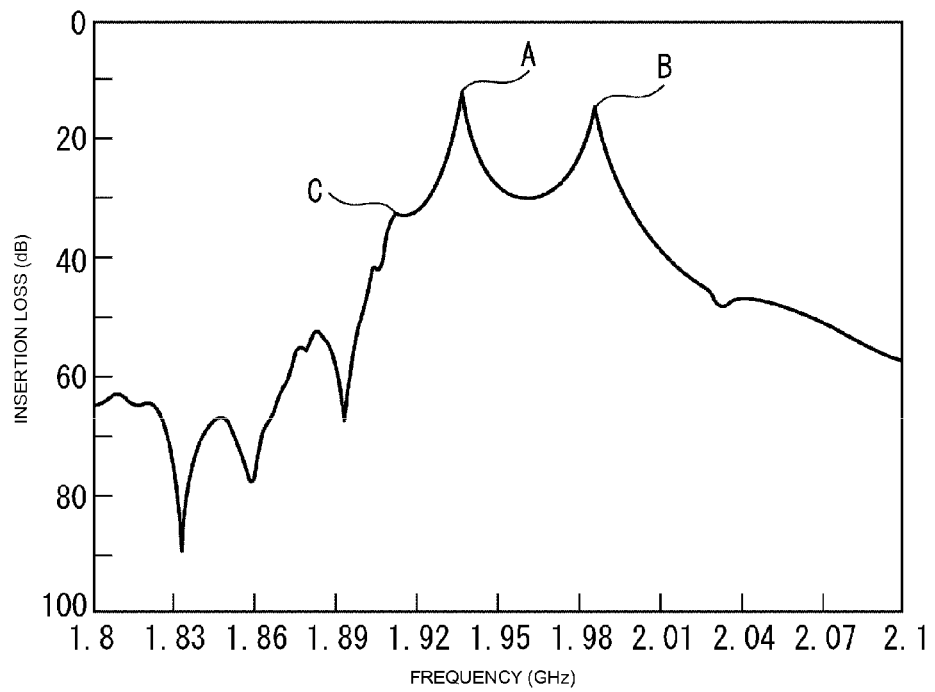
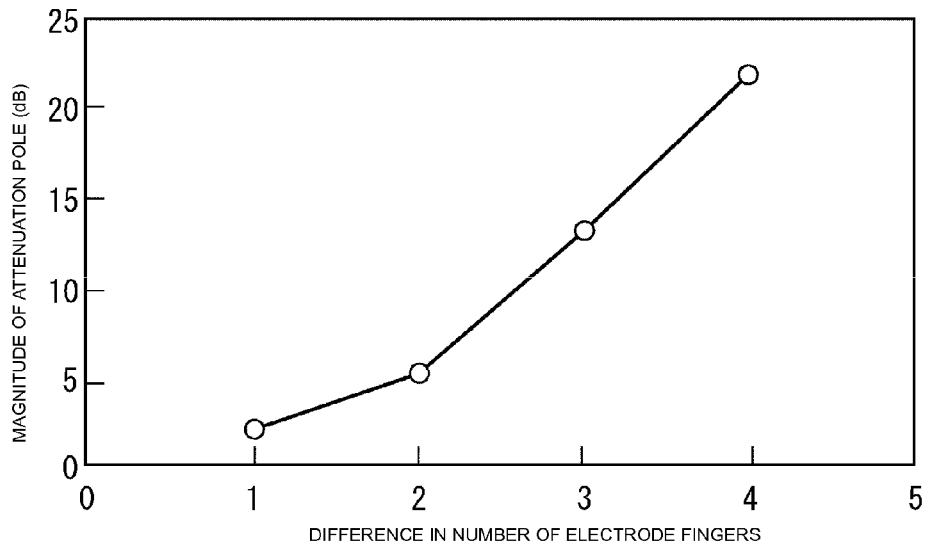

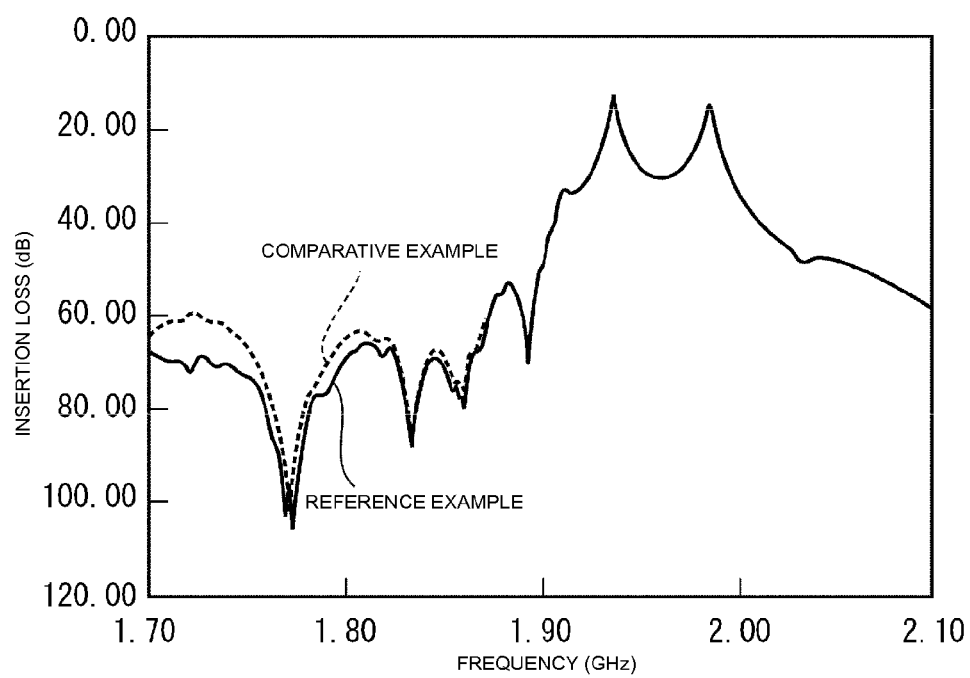

ELASTIC WAVE FILTER DEVICE WITH IDT ELECTRODES THAT INCLUDE A NARROWER-PITCH PORTION

BACKGROUND OF THE INVENTION

1. Field of the Invention

The present invention relates to an elastic wave filter device, and more particularly, to a 3-IDT longitudinally-coupled resonator-type elastic wave filter device including first to third IDT electrodes which are successively arranged in a direction of propagation of elastic waves.

2. Description of the Related Art

In recent years, an elastic wave filter device including a longitudinally-coupled resonator-type elastic wave filter section has been very popular for use as a filter in, e.g., an RF stage and an IF stage of a portable communication terminal because such a filter device has a small size, a light weight, and superior filter characteristics. For example, Japanese Unexamined Patent Application Publication No. 4-54011 discloses an elastic wave filter device including a 3-IDT longitudinally-coupled resonator-type elastic wave filter section.

FIG. 17 illustrates the elastic wave filter device disclosed in Japanese Unexamined Patent Application Publication No. 4-54011. As illustrated in FIG. 17, the elastic wave filter device 100 includes first and second 3-IDT longitudinally-coupled resonator-type elastic wave filter sections 101, 102 which are connected in series. An elastic wave resonator 104 is connected between a ground potential and a junction 103 at which the first 3-IDT longitudinally-coupled resonator-type elastic wave filter section 101 and the second 3-IDT longitudinally-coupled resonator-type elastic wave filter section 102 are connected to each other.

In the elastic wave filter device 100, the elastic wave resonator 104 is arranged such that the resonance frequency of the elastic wave resonator 104 is positioned within a transient band between a pass band and a stop band of each of the first and second 3-IDT longitudinally-coupled resonator-type elastic wave filter sections 101, 102. As a result, the sharpness of the filter characteristics is improved.

In the elastic wave filter device 100 including the elastic wave resonator 104 connected between the junction 103 and the ground potential, as disclosed in Japanese Unexamined Patent Application Publication No. 4-54011, the sharpness of the filter characteristics greatly depends on a Q-value of the elastic wave resonator 104. The Q-value of the elastic wave resonator 104 must be increased in order to realize higher sharpness of the filter characteristics. However, because the Q-value of the elastic wave resonator 104 is substantially determined by a piezoelectric substrate and an electrode material, the amount by which the Q-value of the elastic wave resonator 104 can be increased is limited. Thus, it is difficult to obtain a high level of sharpness of the filter characteristics, which has been in greater demand recently, merely by providing the elastic wave resonator 104.

SUMMARY OF THE INVENTION

To overcome the problems described above, preferred embodiments of the present invention provide an elastic wave filter device having higher sharpness of filter characteristics.

According to a preferred embodiment of the present invention, an elastic wave filter device preferably includes a piezoelectric substrate, and a longitudinally-coupled resonator-type elastic wave filter section. The longitudinally-coupled resonator-type elastic wave filter section preferably includes first to third IDT electrodes, and first and second reflectors. The first to third IDT electrodes are successively arranged on the piezoelectric substrate in a direction of propagation of elastic waves. Each of the first to third IDT electrodes includes a plurality of electrode fingers. The first and second reflectors are arranged on the piezoelectric substrate respectively on both sides of a region in which the first to third IDT electrodes are provided, as viewed in the direction of propagation of the elastic waves. Each of the first to third IDT electrodes preferably includes a narrower-pitch portion provided in an end portion thereof, which is adjacent to another IDT electrode in the direction of propagation of the elastic waves, the narrower-pitch portion having a smaller period of electrode fingers than a period of electrode fingers in the remaining portion of the relevant IDT electrode. The number of electrode fingers in the narrower-pitch portion of the second IDT electrode, which is disposed on the side closer to the first IDT electrode, and the number of electrode fingers in the narrower-pitch portion of the second IDT electrode, which is disposed on the side closer to the third IDT electrode, preferably differ from each other.

According to a preferred embodiment of the present invention, the number of electrode fingers in the narrower-pitch portion of the second IDT electrode, which is disposed on the side closer to the first IDT electrode, and the number of electrode fingers in the narrower-pitch portion of the second IDT electrode, which is disposed on the side closer to the third IDT electrode, preferably differ by two or more from each other. With this construction, the sharpness of the filter characteristics can be further improved.

According to another preferred embodiment of the present invention, a period of the electrode fingers in the narrower-pitch portion of the first IDT electrode and a period of the electrode fingers of the third IDT electrode preferably differ from each other. With this construction, a spike ripple generated within a pass band is minimized or prevented and a satisfactory frequency characteristic is obtained.

According to still another preferred embodiment of the present invention, the number of electrode fingers in the narrower-pitch portion of the second IDT electrode, which is disposed on the side closer to the first IDT electrode, is preferably less than the number of electrode fingers in the narrower-pitch portion of the second IDT electrode, which is disposed on the side closer to the third IDT electrode, and the period of the electrode fingers in the narrower-pitch portion of the first IDT electrode is preferably less than the period of the electrode fingers of the third IDT electrode. With this construction, the sharpness of the filter characteristics in a transient band between a pass band and a stop band is improved, and the spike ripple within the pass band is minimized or prevented.

According to still another preferred embodiment of the present invention, the number of electrode fingers in the narrower-pitch portion of the second IDT electrode, which is disposed on the side closer to the first IDT electrode, is preferably less than the number of electrode fingers in the narrower-pitch portion of the second IDT electrode, which is disposed on the side closer to the third IDT electrode, at least one of the period of the electrode fingers in the narrower-pitch portion of the first IDT electrode and the period of the electrode fingers of the third IDT electrode is not constant, and an average value of the periods of the electrode fingers in the narrower-pitch portion of the first IDT electrode is preferably less than an average value of the periods of the electrode fingers of the third IDT electrode. With this construction, the sharpness of the filter characteristics in the transient band between the pass band and the stop band is improved, and the spike ripple within the pass band is minimized or prevented.

According to still another preferred embodiment of the present invention, the number of electrode fingers in the narrower-pitch portion of the first IDT electrode and the number of electrode fingers in the narrower-pitch portion of the third IDT electrode preferably differ from each other.

According to another preferred embodiment of the present invention, an elastic wave filter device preferably includes a piezoelectric substrate, and a longitudinally-coupled resonator-type elastic wave filter section. The longitudinally-coupled resonator-type elastic wave filter section includes first to third IDT electrodes, and first and second reflectors. The first to third IDT electrodes are successively arranged on the piezoelectric substrate in a direction of propagation of elastic waves. Each of the first to third IDT electrodes includes a plurality of electrode fingers. First and second reflectors are arranged on the piezoelectric substrate respectively on both sides of a region in which the first to third IDT electrodes are provided, as viewed in the direction of propagation of the elastic waves. Each of the first to third IDT electrodes preferably includes a narrower-pitch portion provided in an end portion thereof, which is adjacent to another IDT electrode in the direction of propagation of the elastic waves, the narrower-pitch portion having a smaller period of electrode fingers than a period of electrode fingers in the remaining portion of the relevant IDT electrode. The number of electrode fingers in the narrower-pitch portion of the first IDT electrode and the number of electrode fingers in the narrower-pitch portion of the third IDT electrode preferably differ from each other.

According to still another preferred embodiment of the present invention, the number of electrode fingers in the narrower-pitch portion of the first IDT electrode and the number of electrode fingers in the narrower-pitch portion of the third IDT electrode preferably differ by two or more from each other. With this construction, the sharpness of the filter characteristics is further improved.

According to still another preferred embodiment of the present invention, a period of the electrode fingers in the narrower-pitch portion of the second IDT electrode, which is disposed on the side closer to the first IDT electrode, and a period of the electrode fingers in the narrower-pitch portion of the second IDT electrode, which is disposed on the side closer to the third IDT electrode, preferably differ from each other. With this construction, the spike ripple within the pass band is minimized or prevented and a satisfactory frequency characteristic is obtained.

According to still another preferred embodiment of the present invention, the number of electrode fingers in the narrower-pitch portion of the first IDT electrode is preferably less than the number of electrode fingers in the narrower-pitch portion of the third IDT electrode, and the period of the electrode fingers in the narrower-pitch portion of the second IDT electrode, which is disposed on the side closer to the first IDT electrode, is preferably less than the period of the electrode fingers in the narrower-pitch portion of the second IDT electrode, which is disposed on the side closer to the third IDT electrode. With this construction, the sharpness of the filter characteristics in the transient band between the pass band and the stop band is improved, and the spike ripple within the pass band is minimized or prevented.

According to still another preferred embodiment of the present invention, the number of electrode fingers in the narrower-pitch portion of the first IDT electrode is preferably less than the number of electrode fingers in the narrower-pitch portion of the third IDT electrode, at least one of the period of the electrode fingers in the narrower-pitch portion of the second IDT electrode, which is disposed on the side closer to the first IDT electrode, and the period of the electrode fingers in the narrower-pitch portion of the second IDT electrode, which is disposed on the side closer to the third IDT electrode, is preferably not constant, and an average value of the periods of the electrode fingers in the narrower-pitch portion of the second IDT electrode, which is disposed on the side closer to the first IDT electrode, is preferably less than an average value of the periods of the electrode fingers in the narrower-pitch portion of the second IDT electrode, which is disposed on the side closer to the third IDT electrode. With this construction, the sharpness of the filter characteristics in the transient band between the pass band and the stop band is improved, and the spike ripple within the pass band is minimized or prevented.

According to still another preferred embodiment of the present invention, the narrower-pitch portions of the first to third IDT electrodes are preferably constructed such that a frequency of an attenuation pole caused due to a 1st-order resonance mode of the longitudinally-coupled resonator-type elastic wave filter section is located within a transient band which is positioned between a pass band and a stop band of the longitudinally-coupled resonator-type elastic wave filter section.

With various preferred embodiments the present invention, since the number of electrode fingers in the narrower-pitch portion of the second IDT electrode, which is disposed on the side closer to the first IDT electrode, and the number of electrode fingers in the narrower-pitch portion of the second IDT electrode, which is disposed on the side closer to the third IDT electrode, preferably differ from each other, or since the number of electrode fingers in the narrower-pitch portion of the first IDT electrode and the number of electrode fingers in the narrower-pitch portion of the third IDT electrode preferably differ from each other, the 1st-order resonance mode is generated in the longitudinally-coupled resonator-type elastic wave filter section, and the generated 1st-order resonance mode acts to increase an insertion loss in the transient band that is positioned between the pass band and the stop band. As a result, the sharpness of the filter characteristics is improved and the elastic wave filter device having satisfactory filter characteristics is provided.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 4 is a graph representing the insertion losses of respective elastic wave filter devices in a first example and a first comparative example.

FIG. 5 is a graph representing the insertion losses of respective first longitudinally-coupled resonator-type elastic wave filter sections in second and third examples and the first comparative example.

FIG. 6 is a graph representing the insertion losses of respective first longitudinally-coupled resonator-type elastic wave filter sections in fourth and fifth examples and the second example.

FIG. 7(a) illustrates the current distribution in a 0th-order resonance mode. FIG. 7(b) illustrates the current distribution in a 2nd-order resonance mode. FIG. 7(c) illustrates the current distribution in an I-I intermediate resonance mode. FIG. 7(d) illustrates the current distribution in a 1st-order resonance mode.

FIG. 8 is a graph obtained by extracting an electrical characteristic of only the longitudinally-coupled resonator-type elastic wave filter section in the elastic wave filter device of the first comparative example in order to confirm resonance points in various resonance modes with omission of characteristic impedance.

FIG. 9 is a graph representing the relation of a difference between the number of electrode fingers in each of narrower-pitch portions and the number of electrode fingers in each of narrower-pitch portions on the side closer to a third IDT electrode with respect to the magnitude of an attenuation pole caused due to the 1st-order resonation mode, when impedance is set to about 1 Ω.

FIG. 10 is a graph representing the insertion loss of a first longitudinally-coupled resonator-type elastic wave filter section in a reference example.

DETAILED DESCRIPTION OF THE PREFERRED EMBODIMENTS

Preferred embodiments of the present invention will be described with reference to the drawings.

First Preferred Embodiment

An elastic wave filter device 1 according to a first preferred embodiment of the present invention is a UMTS-band2 reception filter having a balance-unbalance conversion function. In the elastic wave filter device 1, the impedance of an unbalance signal terminal 2 is preferably about 50Ω, for example, and the impedance of each of first and second balance signal terminals 3, 4 is preferably about 100Ω, for example. The transmission frequency band of the UMTS-band2 reception filter is preferably about 1.85 GHz to about 1.91 GHz and the reception frequency band thereof is preferably about 1.93 GHz to about 1.99 GHz.

Figure 1:
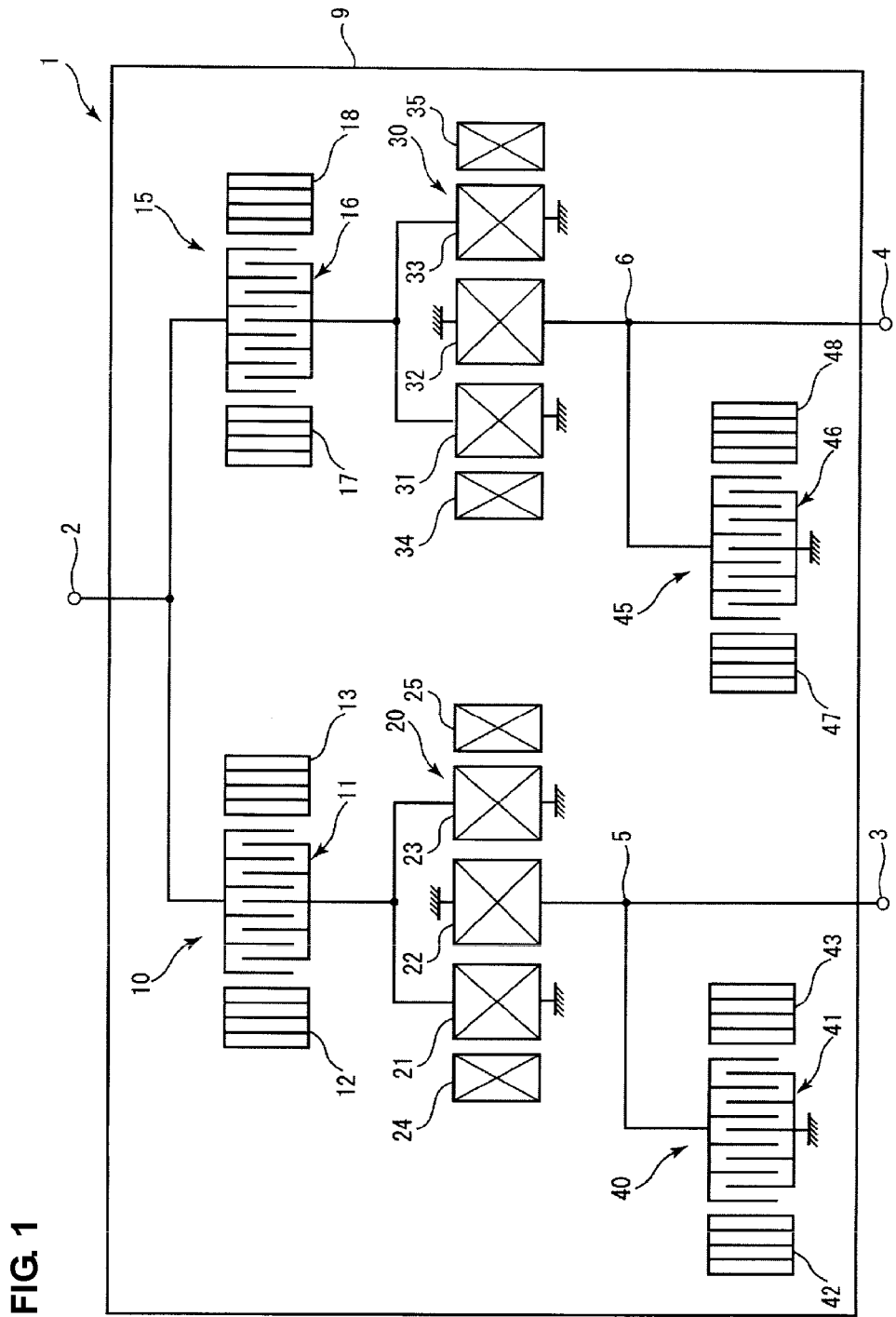
FIG. 1 is a schematic view illustrating the construction of an elastic wave filter device according to a first preferred embodiment of the present invention.

The elastic wave filter device 1 according to this preferred embodiment is an elastic wave filter device utilizing elastic waves, such as acoustic surface waves and acoustic boundary waves. FIG. 1 is a schematic view illustrating the construction of the elastic wave filter device 1 according to this preferred embodiment. It is noted that, in FIG. 1, an IDT electrode and a grating reflector are each illustrated in simplified form, and that the number of electrode fingers in each of the illustrated IDT electrode and the grating reflector is less than the actual number of electrode fingers. Also, in FIG. 1, the IDT electrodes and the grating reflectors of first and second longitudinally-coupled resonator-type elastic wave filter sections 20, 30 are symbolically illustrated by putting a mark "x" in a rectangular box.

As illustrated in FIG. 1, the elastic wave filter device 1 includes a piezoelectric substrate 9. In this preferred embodiment, the piezoelectric substrate 9 is preferably made of X-propagation $LiTaO_3$ with Y-cut of 40±5°, for example. The piezoelectric substrate 9 may be made of some other suitable piezoelectric substrate material than $LiTaO_3$. One example of the other suitable piezoelectric substrate materials is $LiNbO_3$.

The first and second longitudinally-coupled resonator-type elastic wave filter sections 20, 30, first and second serial resonators 10, 15, and first and second parallel resonators 40, 45 are preferably provided on the piezoelectric substrate 9. In this preferred embodiment, the first and second longitudinally-coupled resonator-type elastic wave filter sections 20, 30, the first and second serial resonators 10, 15, and the first and second parallel resonators 40, 45 are preferably defined by Al electrodes, for example. The filter sections and resonators may be formed by using other conductive materials, such as Au, Ag and Cu, than Al, for example. As an alternative, they may be made of a laminate including a plurality of conductive layers.

Preferably, the first longitudinally-coupled resonator-type elastic wave filter section 20 is connected between the unbalance signal terminal 2 and the first balance signal terminal 3. On the other hand, the second longitudinally-coupled resonator-type elastic wave filter section 30 is connected between the unbalance signal terminal 2 and the second balance signal terminal 4.

Preferably, the first serial resonator 10 is connected between the unbalance signal terminal 2 and the first longitudinally-coupled resonator-type elastic wave filter section 20. The first serial resonator 10 preferably includes an IDT electrode 11 including a pair of interdigitated comb teeth electrodes, and first and second grating reflectors 12, 13 which are arranged respectively on both sides of the IDT electrode 11 in the direction of propagation of the elastic waves.

On the other hand, the second serial resonator 15 is preferably connected between the unbalance signal terminal 2 and the second longitudinally-coupled resonator-type elastic wave filter section 30. The second serial resonator 15 preferably includes an IDT electrode 16 including a pair of interdigitated comb teeth electrodes, and first and second grating reflectors 17, 18 which are arranged respectively on both sides of the IDT electrode 16 in the direction of propagation of the elastic waves.

The first and second serial resonators 10, 15 are configured such that respective resonance frequencies of the first and second serial resonators 10, 15 are positioned within pass bands of the first and second longitudinally-coupled resonator-type elastic wave filter sections 20, 30, and that respective anti-resonance frequencies of the first and second serial resonators 10, 15 are positioned within transient bands between pass bands and stop bands of the first and second longitudinally-coupled resonator-type elastic wave filter sections 20, 30. As a result, the sharpness of the filter characteristics in the transient band is improved.

The first parallel resonator 40 is preferably connected between a ground potential and a junction 5 between the first longitudinally-coupled resonator-type elastic wave filter section 20 and the first balance signal terminal 3. The first parallel resonator 40 preferably includes an IDT electrode 41 including a pair of interdigitated comb teeth electrodes, and first and second grating reflectors 42, 43 which are arranged respectively on both sides of the IDT electrode 41 in the direction of propagation of the elastic waves.

On the other hand, the second parallel resonator 45 is preferably connected between the ground potential and a junction between the second longitudinally-coupled resonator-type elastic wave filter section 30 and the second balance signal terminal 4. The second parallel resonator 45 preferably includes an IDT electrode 46 including a pair of interdigitated comb teeth electrodes, and first and second grating reflectors 47, 48 which are arranged respectively on both sides of the IDT electrode 46 in the direction of propagation of the elastic waves.

The first and second parallel resonators 40, 45 are configured such that respective anti-resonance frequencies of the first and second parallel resonators 40, 45 are positioned within the pass bands of the first and second longitudinally-coupled resonator-type elastic wave filter sections 20, 30, and that respective resonance frequencies of the first and second parallel resonators 40, 45 are positioned outside the pass bands of the first and second longitudinally-coupled resonator-type elastic wave filter sections 20, 30 on the lower frequency side. As a result, the sharpness of the filter characteristics in the transient band is improved.

Figure 2:
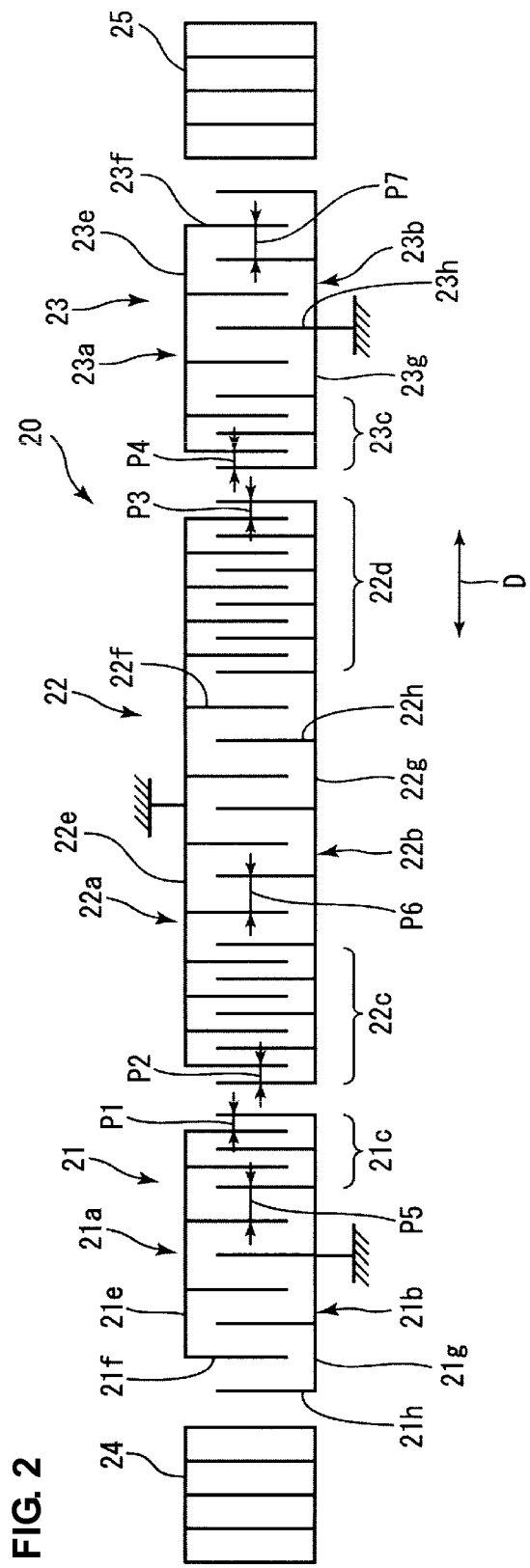
FIG. 2 is a schematic view illustrating the construction of a first longitudinally-coupled resonator-type elastic wave filter section in the first preferred embodiment of the present invention.
Figure 3:
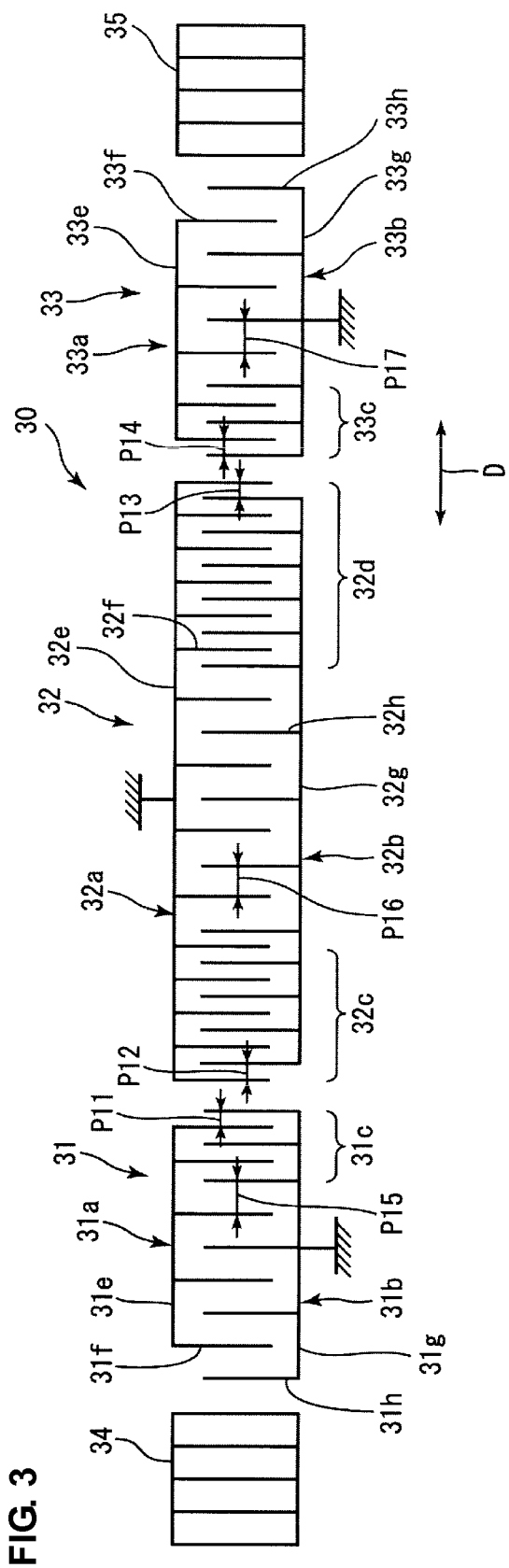
FIG. 3 is a schematic view illustrating the construction of a second longitudinally-coupled resonator-type elastic wave filter section in the first preferred embodiment of the present invention.

The construction of the first and second longitudinally-coupled resonator-type elastic wave filter sections 20, 30 will be described below. FIG. 2 is a schematic view illustrating the construction of the first longitudinally-coupled resonator-type elastic wave filter section 20, and FIG. 3 is a schematic view illustrating the construction of the second longitudinally-coupled resonator-type elastic wave filter section 30.

As illustrated in FIGS. 1 and 2, the first longitudinally-coupled resonator-type elastic wave filter section 20 preferably includes first to third IDT electrodes 21 to 23, which are successively arranged on the piezoelectric substrate 9 in order in the direction D of propagation of the elastic waves. First and second grating reflectors 24, 25 are respectively arranged on both sides of a region in which the first to third IDT electrodes 21 to 23 are disposed, as viewed in the direction D of propagation of the elastic waves.

As illustrated in FIG. 2, the first IDT electrode 21 preferably includes first and second comb teeth electrodes 21a, 21b that are interdigitated with each other. The first and second comb teeth electrodes 21a, 21b include respectively bus bars 21e and 21g and a plurality of electrode fingers 21f and 21h. A narrower-pitch portion 21c is provided in an end portion of the first IDT electrode 21, which is adjacent to the second IDT electrode 22 in the direction D of propagation of the elastic waves. A period P1 of the electrode fingers 21f and 21h in the narrower-pitch portion 21c is preferably less than a period P5 of the electrode fingers 21f and 21h of the first IDT electrode 21 in the other portion thereof than the narrower-pitch portion 21c. In this description, the term "period of electrode fingers" means a center-to-center distance between electrode fingers that are adjacent to each other in the direction D of propagation of the elastic waves.

The second IDT electrode 22 preferably includes first and second interdigitated comb teeth electrodes 22a, 22b. The first and second comb teeth electrodes 22a, 22b include respectively bus bars 22e and 22g and a plurality of electrode fingers 22f and 22h. A narrower-pitch portion 22c on the first IDT electrode side is preferably provided in an end portion of the second IDT electrode 22, which is adjacent to the first IDT electrode 21 in the direction D of propagation of the elastic waves. Also, a narrower-pitch portion 22d on the third IDT electrode side is preferably provided in an end portion of the second IDT electrode 22, which is adjacent to the third IDT electrode 23 in the direction D of propagation of the elastic waves. A period P2 of the electrode fingers 22f and 22h in the narrower-pitch portion 22c on the first IDT electrode side is preferably less than a period P6 of the electrode fingers 22f and 22h of the second IDT electrode 22 in the remaining portion thereof except for the narrower-pitch portion 22c on the first IDT electrode side and the narrower-pitch portion 22d on the third IDT electrode side. Similarly, a period P3 of the electrode fingers 22f and 22h in the narrower-pitch portion 22d on the third IDT electrode side is preferably less than the period P6 of the electrode fingers 22f and 22h of the second IDT electrode 22 in the remaining portion thereof except for the narrower-pitch portion 22c on the first IDT electrode side and the narrower-pitch portion 22d on the third IDT electrode side.

The third IDT electrode 23 includes first and second interdigitated comb teeth electrodes 23a, 23b. The first and second comb teeth electrodes 23a, 23b include respectively bus bars 23e and 23g and a plurality of electrode fingers 23f and 23h. A narrower-pitch portion 23c is preferably provided in an end portion of the third IDT electrode 23, which is adjacent to the second IDT electrode 22 in the direction D of propagation of the elastic waves. A period P4 of the electrode fingers 23f and 23h in the narrower-pitch portion 23c is preferably less than a period P7 of the electrode fingers 23f and 23h of the third IDT electrode 23 in the other portion thereof than the narrower-pitch portion 23c.

The second longitudinally-coupled resonator-type elastic wave filter section 30 preferably has substantially the same construction as that of the first longitudinally-coupled resonator-type elastic wave filter section 20 except that a phase preferably differs in comb teeth electrodes of the second IDT electrode on the balance terminal side. More specifically, as illustrated in FIGS. 1 and 3, the second longitudinally-coupled resonator-type elastic wave filter section 30 preferably includes first to third IDT electrodes 31 to 33, which are successively arranged on the piezoelectric substrate 9 in order in the direction D of propagation of the elastic waves. First and second grating reflectors 34, 35 are respectively arranged on both sides of a region in which the first to third IDT electrodes 31 to 33 are disposed, as viewed in the direction D of propagation of the elastic waves.

As illustrated in FIG. 3, the first IDT electrode 31 includes first and second interdigitated comb teeth electrodes 31a, 31b. The first and second comb teeth electrodes 31a, 31b include respectively bus bars 31e and 31g and a plurality of electrode fingers 31f and 31h. A narrower-pitch portion 31c is preferably provided in an end portion of the first IDT electrode 31, which is adjacent to the second IDT electrode 32 in the direction D of propagation of the elastic waves. A period P11 of the electrode fingers 31*f* and 31*h* in the narrower-pitch portion 31*c* is set to be less than a period P15 of the electrode fingers 31*f* and 31*h* of the first IDT electrode 31 in the other portion thereof than the narrower-pitch portion 31*c*.

The second IDT electrode 32 includes first and second interdigitated comb teeth electrodes 32*a*, 32*b*. The first and second comb teeth electrodes 32*a*, 32*b* include respectively bus bars 32*e* and 32*g* and a plurality of electrode fingers 32*f* and 32*h*. A narrower-pitch portion 32*c* on the first IDT electrode side is preferably provided in an end portion of the second IDT electrode 32, which is adjacent to the first IDT electrode 31 in the direction D of propagation of the elastic waves. Also, a narrower-pitch portion 32*d* on the third IDT electrode side is preferably provided in an end portion of the second IDT electrode 32, which is adjacent to the third IDT electrode 33 in the direction D of propagation of the elastic waves. A period P12 of the electrode fingers 32*f* and 32*h* in the narrower-pitch portion 32*c* on the first IDT electrode side is preferably less than a period P16 of the electrode fingers 32*f* and 32*h* of the second IDT electrode 32 in the remaining portion thereof except for the narrower-pitch portion 32*c* on the first IDT electrode side and the narrower-pitch portion 32*d* on the third IDT electrode side. Similarly, a period P13 of the electrode fingers 32*f* and 32*h* in the narrower-pitch portion 32*d* on the third IDT electrode side is preferably less than the period P16 of the electrode fingers 32*f* and 32*h* of the second IDT electrode 32 in the remaining portion thereof except for the narrower-pitch portion 32*c* on the first IDT electrode side and the narrower-pitch portion 32*d* on the third IDT electrode side.

The third IDT electrode 33 includes first and second interdigitated comb teeth electrodes 33*a*, 33*b*. The first and second comb teeth electrodes 33*a*, 33*b* include respectively bus bars 33*e* and 33*g* and a plurality of electrode fingers 33*f* and 33*h*. A narrower-pitch portion 33*c* is preferably provided in an end portion of the third IDT electrode 33, which is adjacent to the second IDT electrode 32 in the direction D of propagation of the elastic waves. A period P14 of the electrode fingers 33*f* and 33*h* in the narrower-pitch portion 33*c* is preferably less than a period P17 of the electrode fingers 33*f* and 33*h* of the third IDT electrode 33 in the other portion thereof than the narrower-pitch portion 33*c*.

First Example

As a first example, the above-described elastic wave filter device 1 of the first preferred embodiment was fabricated based on the following design parameters and the insertion loss thereof was measured.

First and second longitudinally-coupled resonator-type elastic wave filter sections 20, 30:
Crossing width: about 30.4λ (λ: wavelength determined depending on the period of the IDT electrode=about 2.0405 μm)
Number of electrode fingers in each of the first and third IDT electrodes 21, 23, 31 and 33: 39
Number of electrode fingers in each of the narrower-pitch portions 21*c*, 23*c*, 31*c* and 33*c*: 5
Periods P1 and P11 of respective electrode fingers in the narrower-pitch portions 21*c* and 31*c*: about 1.8885 μm
Periods P4 and P14 of respective electrode fingers in the narrower-pitch portions 23*c* and 33*c*: about 1.9785 μm (about 0.09 μm more than the period of the electrode fingers in the narrower-pitch portions 21*c* and 31*c*)
Number of electrode fingers in the second IDT electrode 22: 43
Number of electrode fingers in the second IDT electrode 32: 43
Number of electrode fingers in the narrower-pitch portion 22*c* on the first IDT electrode side: 3
Number of electrode fingers in the narrower-pitch portion 32*c* on the first IDT electrode side: 3
Number of electrode fingers in the narrower-pitch portion 22*d* on the third IDT electrode side: 7
Number of electrode fingers in the narrower-pitch portion 32*d* on the third IDT electrode side: 7
Periods P2, P12, P3 and P13 of respective electrode fingers in the narrower-pitch portions 22*c*, 32*c*, 22*d* and 32*d* on the first and third IDT electrode sides: about 2.0118 μm
Number of electrode fingers in each of the first and second grating reflectors 24, 25, 34 and 35: 65
Metallization ratio: about 0.68
Electrode film thickness: about 0.091λ
First and second serial resonators 10, 15;
Crossing width: about 11.0λ (λ=about 1.9528 μm)
Number of electrode fingers in each of the IDT electrodes 11 and 16: 71
Number of electrode fingers in each of the first and second grating reflectors 12, 13, 17 and 18: 18
Metallization ratio: about 0.60
Electrode film thickness: 0.095λ
First and second parallel resonators 40, 45;
Crossing width: about 15.0λ (λ=about 2.0476 μm)
Number of electrode fingers in each of the IDT electrodes 41 and 46: 111
Number of electrode fingers in each of the first and second grating reflectors 42, 43, 47 and 48: 18
Metallization ratio: about 0.60
Electrode film thickness: about 0.091λ

Further, as a first comparative example, an elastic wave filter device was fabricated based on the same design parameters as those in the above-described first example except that the number of electrode fingers in each of the narrower-pitch portions 22*c* and 32*c* on the first IDT electrode side and the number of electrode fingers in each of the narrower-pitch portions 22*d* and 32*d* on the third IDT electrode side were both set to four, and that the period P1 of the electrode fingers in each of the narrower-pitch portions 21*c* and 31*c* was made equal to the period P4 of the electrode fingers in each of the narrower-pitch portions 23*c* and 33*c*. The insertion loss of the fabricated elastic wave filter device was then measured.

FIG. 4 illustrates the insertion losses of respective elastic wave filter devices in the first example and the first comparative example. In FIG. 4, a solid line indicates the insertion loss of the elastic wave filter device in the first example, and a one-dot-chain line indicates the insertion loss of the elastic wave filter device in the first comparative example.

As illustrated in FIG. 4, in the first example in which the number of electrode fingers in each of the narrower-pitch portions 22*c* and 32*c* on the first IDT electrode side differs from the number of electrode fingers in each of the narrower-pitch portions 22*d* and 32*d* on the third IDT electrode side, higher sharpness of the filter characteristics in a transient band on the lower frequency side is obtained as compared to the first comparative example. More specifically, in the transient band on the lower frequency side, an interval from the frequency at which the insertion loss is about 3.5 dB to the frequency at which the insertion loss is about 47 dB is reduced in the first example by about 2 MHz are compared to the first comparative example. From this result, it can be understood that the sharpness of the filter characteristics in the transient band is improved by setting the number of electrode fingers in each of the narrower-pitch portions 22c and 32c on the first IDT electrode side to be different from the number of electrode fingers in each of the narrower-pitch portions 22d and 32d on the third IDT electrode side.

Further, in the first example in which the period of the electrode fingers in each of the narrower-pitch portions 21c and 31c is less than the period of the electrode fingers in each of the narrower-pitch portions 23c and 33c by about 0.09 μm, a large spike ripple was not observed in the pass band. From this result, it can be understood that even when the number of electrode fingers in each of the narrower-pitch portions 22c and 32c on the first IDT electrode side differs from the number of electrode fingers in each of the narrower-pitch portions 22d and 32d on the third IDT electrode side, the spike ripple within the pass band is minimized or prevented and, thus, a satisfactory frequency characteristic in the pass band and higher sharpness of the filter characteristics in the transient band are simultaneously obtained by setting the period of the electrode fingers in each of the narrower-pitch portions 21c and 31c to be less than the period of the electrode fingers in each of the narrower-pitch portions 23c and 33c.

Second and Third Examples

As a second example, an elastic wave filter device was fabricated based on the same design parameters as those in the above-described first example except that the period P1 of the electrode fingers in each of the narrower-pitch portions 21c and 31c was preferably set to be equal or substantially equal to the period P4 of the electrode fingers in each of the narrower-pitch portions 23c and 33c. The insertion loss of a first longitudinally-coupled resonator-type elastic wave filter section in the elastic wave filter device of the second example was then measured.

Also, as a third example, an elastic wave filter device was fabricated based on the same design parameters as those in the second example except that the number of electrode fingers in each of the narrower-pitch portions 22d and 32d on the third IDT electrode side was set to five. The insertion loss of a first longitudinally-coupled resonator-type elastic wave filter section in the elastic wave filter device of the third example was then measured.

FIG. 5 illustrates the insertion losses of the respective first longitudinally-coupled resonator-type elastic wave filter sections in the second and third examples and the first comparative example. In FIG. 5, a solid line indicates the insertion loss of the first longitudinally-coupled resonator-type elastic wave filter section in the second example, a one-dot-chain line indicates the insertion loss of the first longitudinally-coupled resonator-type elastic wave filter section in the third example, and a two-dot-chain line indicates the insertion loss of the first longitudinally-coupled resonator-type elastic wave filter section in the first comparative example.

As illustrated in FIG. 5, an attenuation pole caused due to the 1st-order resonance mode was confirmed near a frequency of about 1.92 GHz in the second and third examples in which the number of electrode fingers in each of the narrower-pitch portions 22c and 32c on the first IDT electrode side differs from the number of electrode fingers in each of the narrower-pitch portions 22d and 32d on the third IDT electrode side. Further, in the second example in which the difference between the number of electrode fingers in each of the narrower-pitch portions 22d and 32d on the third IDT electrode side and the number of electrode fingers in each of the narrower-pitch portions 22c and 32c on the first IDT electrode side is four, the attenuation pole was confirmed to have a greater magnitude than in the third example in which the difference between the number of electrode fingers in each of the narrower-pitch portions 22d and 32d on the third IDT electrode side and the number of electrode fingers in each of the narrower-pitch portions 22c and 32c on the first IDT electrode side is two. From these results, it is understood that, by setting the difference between the number of electrode fingers in each of the narrower-pitch portions 22d and 32d on the third IDT electrode side and the number of electrode fingers in each of the narrower-pitch portions 22c and 32c on the first IDT electrode side to a larger value, the magnitude of the attenuation pole caused due to the 1st-order resonation mode can be increased and, therefore, the sharpness of the filter characteristics in the transient band can be further improved.

Also, a spike ripple was confirmed near a frequency of about 1.98 GHz in the second and third examples in which the number of electrode fingers in each of the narrower-pitch portions 22d and 32d on the third IDT electrode side differs from the number of electrode fingers in each of the narrower-pitch portions 22c and 32c on the first IDT electrode side. Further, in the second example in which the difference between the number of electrode fingers in each of the narrower-pitch portions 22d and 32d on the third IDT electrode side and the number of electrode fingers in each of the narrower-pitch portions 22c and 32c on the first IDT electrode side is four, a larger spike ripple was confirmed as compared to the third example in which the difference between the number of electrode fingers in each of the narrower-pitch portions 22d and 32d on the third IDT electrode side and the number of electrode fingers in each of the narrower-pitch portions 22c and 32c on the first IDT electrode side is two.

Fourth and Fifth Examples

As fourth and fifth examples, elastic wave filter devices were fabricated based on the same design parameters as those in the above-described first example except for that the difference between the period P1, P11 of the electrode fingers in the narrower-pitch portion 21c, 31c and the period P4, P14 of the electrode fingers in the narrower-pitch portion 23c, 33c was changed. More specifically, in the fourth example, the period P1, P11 of the electrode fingers in the narrower-pitch portion 21c, 31c was set to be less than the period P4, P14 of the electrode fingers in the narrower-pitch portion 23c, 33c by about 0.04 μm. In the fifth example, the period P1, P11 of the electrode fingers in the narrower-pitch portion 21c, 31c was set to be less than the period P4, P14 of the electrode fingers in the narrower-pitch portion 23c, 33c by about 0.02 μm.

Further, the insertion losses of respective first longitudinally-coupled resonator-type elastic wave filter sections in the elastic wave filter devices of the fourth and fifth examples were measured. The measured results are illustrated in FIG. 6. In FIG. 6, a solid line indicates the insertion loss of the first longitudinally-coupled resonator-type elastic wave filter section in the fourth example, a one-dot-chain line indicates the insertion loss of the first longitudinally-coupled resonator-type elastic wave filter section in the second example, and a two-dot-chain line indicates the insertion loss of the first longitudinally-coupled resonator-type elastic wave filter section in the fifth example.

As illustrated in FIG. 6, in the fourth example in which the period P1, P11 of the electrode fingers in the narrower-pitch portion 21c, 31c is less than the period P4, P14 of the electrode fingers in the narrower-pitch portion 23c, 33c by about 0.04 μm, a smaller spike ripple was confirmed as compared to the fifth example in which the period P1, P11 of the electrode fingers in the narrower-pitch portion 21c, 31c is less than the period P4, P14 of the electrode fingers in the narrower-pitch portion 23c, 33c by about 0.02 μm. From such a result, it is understood that the spike ripple in the pass band can be reduced by increasing the difference between the period P1, P11 of the electrode fingers in the narrower-pitch portion 21c, 31c and the period P4, P14 of the electrode fingers in the narrower-pitch portion 23c, 33c.

As a reference example, an elastic wave filter device was fabricated based on the same design parameters as those in the above-described first example except for that the period P1, P11 of the electrode fingers in the narrower-pitch portion 21c, 31c was set larger than the period P4, P14 of the electrode fingers in the narrower-pitch portion 23c, 33c. Further, the insertion loss of a first longitudinally-coupled resonator-type elastic wave filter section in the elastic wave filter device of the reference example was measured. In the reference example, a larger spike ripple was confirmed as compared to the second example. From this result, it is understood that, when the number of electrode fingers in each of the narrower-pitch portions 22c and 32c on the first IDT electrode side is less than the number of electrode fingers in each of the narrower-pitch portions 22d and 32d on the third IDT electrode side, the spike ripple in the pass band can be effectively minimized or prevented by setting the period P1, P11 of the electrode fingers in the narrower-pitch portion 21c, 31c to be less than the period P4, P14 of the electrode fingers in the narrower-pitch portion 23c, 33c.

FIGS. 7(a) to 7(d) illustrate current distributions in various resonance modes generated in a longitudinally-coupled resonator-type elastic wave filter which is designed to be bilaterally symmetrical in the left-and-right direction. In the longitudinally-coupled resonator-type elastic wave filter including three IDT electrodes, a pass band is provided based on three resonance modes, i.e., a 0th-order resonance mode generated due to the current distribution illustrated in FIG. 7(a), a 2nd-order resonance mode generated due to the current distribution illustrated in FIG. 7(b), a resonance mode generated due to the current distribution illustrated in FIG. 7(c), which has a peak at a position between the IDT electrodes adjacent to each other (hereinafter referred to as an "I-I intermediate resonance mode").

FIG. 8 is a graph obtained by extracting an electrical characteristic of only the longitudinally-coupled resonator-type elastic wave filter section in the elastic wave filter device of the above-described first comparative example in order to confirm resonance points in various resonance modes with omission of characteristic impedance. In FIG. 8, a symbol A represents the resonance point (frequency of about 1.935 GHz) in the 0th-order resonance mode. A symbol C represents the resonance point (frequency of about 1.91 GHz) in the 2nd-order resonance mode. A symbol B represents the resonance point (frequency of about 1.99 GHz) in the I-I intermediate resonance mode.

Previously, design parameters of a longitudinally-coupled resonator-type elastic wave filter were set to be bilaterally symmetrical. The reason is that, if the design parameters of the longitudinally-coupled resonator-type elastic wave filter are set to be bilaterally asymmetrical, the 1st-order resonance mode having a resonance point between the resonance point in the 0th-order resonance mode and the resonance point in the 2nd-order resonance mode occurs, whereby an attenuation pole is generated.

Figure 7:
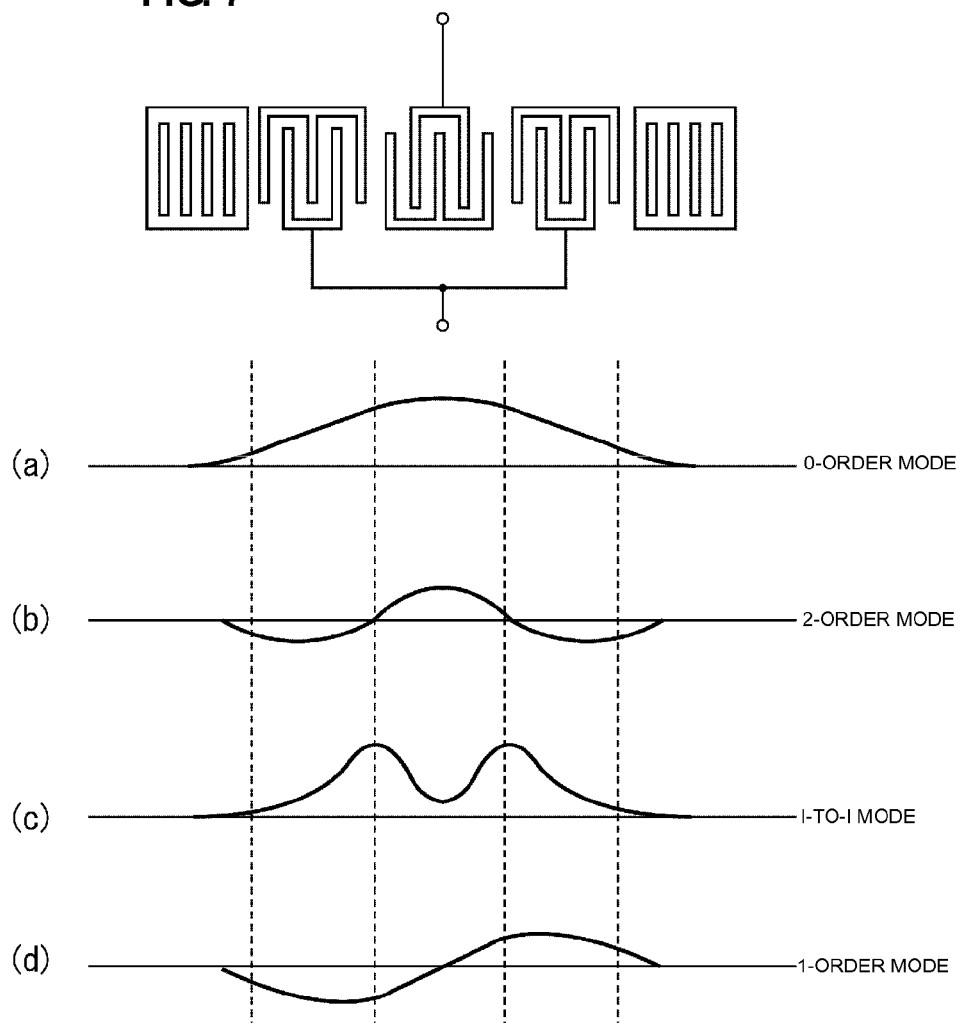
FIGS. 7(a) to 7(d) illustrate current distributions in various resonance modes in a 3-IDT longitudinally-coupled resonator-type elastic wave filter section including no narrower-pitch portions.

To explain in more detail, in the longitudinally-coupled resonator-type elastic wave filter including three IDT electrodes which have bilaterally symmetrical design parameters, as shown in FIG. 7(d), because the current distribution in the 1st-order resonance mode provides a current of which the sign is reversed substantially at a center of the IDT electrode positioned at a center of the filter, no current flows through the IDT electrode positioned at the center. Accordingly, an attenuation pole corresponding to the 1st-order resonance mode is not generated. On the other hand, when a design parameter is set to be bilaterally asymmetrical, the attenuation pole corresponding to the 1st-order resonance mode is generated. The attenuation pole caused due to the 1st-order resonance mode is generated within the pass band. For this reason, the design parameters have generally been set to be bilaterally symmetrical so as to prevent the generation of the 1st-order resonance mode.

In contrast, in this preferred embodiment, the number of electrode fingers in each of the narrower-pitch portions 22c and 32c on the first IDT electrode side of the second IDT electrodes 22 and 32 preferably differs from the number of electrode fingers in each of the narrower-pitch portions 22d and 32d on the third IDT electrode side of the second IDT electrodes 22 and 32. That is, in this preferred embodiment, the number of electrode fingers in each of the narrower-pitch portions 22c and 32c on the first IDT electrode side of the second IDT electrodes 22 and 32 is preferably set to be less than the number of electrode fingers in each of the narrower-pitch portions 22d and 32d on the third IDT electrode side of the second IDT electrodes 22 and 32. Therefore, in the first and second longitudinally-coupled resonator-type elastic wave filter sections 20, 30, the 1st-order resonance mode is generated in addition to the 0th-order resonance mode, the 2nd-order resonance mode, and the I-I intermediate resonance mode. In this preferred embodiment, the narrower-pitch portions 22c and 32c on the first IDT electrode side and the narrower-pitch portions 22d and 32d on the third IDT electrode side are preferably configured such that a ripple (attenuation pole) caused due to the 1st-order resonation mode is positioned within the transient band of each of the first and second longitudinally-coupled resonator-type elastic wave filter sections 20, 30 on the lower frequency side. As a result, the sharpness of the filter characteristics in the transient band on the lower frequency side is improved.

More specifically, in this preferred embodiment, the attenuation pole caused due to the 1st-order resonance mode is preferably positioned within the transient band on the lower frequency side between the resonance points in the 0th-order resonance mode and the 2nd-order resonance mode. Thus, the sharpness of the filter characteristics in the transient band on the lower frequency side is improved.

Therefore, by improving the sharpness of the filter characteristics in the transient band, a manufacturing tolerance with respect to frequency is increased and manufacturing of the elastic wave filter device 1 is facilitated. Further, changes in the filter characteristics depending upon changes in temperature of the elastic wave filter device 1 are reduced.

As described above, the sharpness of the filter characteristics in the transient band is improved preferably by setting the number of electrode fingers in each of the narrower-pitch portions 22c and 32c on the first IDT electrode side to be different from the number of electrode fingers in each of the narrower-pitch portions 22d and 32d on the third IDT electrode side. However, when the number of electrode fingers in each of the narrower-pitch portions 22c and 32c on the first IDT electrode side and the number of electrode fingers in each of the narrower-pitch portions 22d and 32d on the third IDT electrode side are set to be different from each other so as to make each of the first and second longitudinally-coupled resonator-type elastic wave filter sections 20, 30 bilaterally asymmetrical, a spike ripple is generated within the pass band because of a shift of the position of the resonance point in the I-I intermediate resonance mode.

In contrast, in this preferred embodiment, the period P1 of the electrode fingers in the narrower-pitch portions 21c, 31c of the first IDT electrodes 21, 31 and the period P4 of the electrode fingers in the narrower-pitch portions 23c, 33c of the third IDT electrodes 23, 33 are preferably set to be different from each other. More specifically, the period P1 is preferably set to be less than the period P4. This setting makes it possible to minimize or prevent the spike ripple generated within the pass band because of a shift of the position of the resonance point in the I-I intermediate resonance mode, the shift being caused due to the fact that the bilateral symmetry in each of the first and second longitudinally-coupled resonator-type elastic wave filter sections 20, 30 is not present.

Stated another way, since the number of electrode fingers in each of the narrower-pitch portions 22c and 32c on the first IDT electrode side is preferably set to be less than the number of electrode fingers in each of the narrower-pitch portions 22d and 32d on the third IDT electrode side and the period P1 of the electrode fingers in the narrower-pitch portions 21c, 31c is preferably set to be less than the period P4 of the electrode fingers in the narrower-pitch portion 23c, 33c, the sharpness of the filter characteristics in the transient band is improved and the spike ripple in the pass band is minimized or prevented at the same time.

From the standpoint of further improving the sharpness of the filter characteristics, it is preferable to increase the difference between the number of electrode fingers in each of the narrower-pitch portions 22c and 32c on the first IDT electrode side and the number of electrode fingers in each of the narrower-pitch portions 22d and 32d on the third IDT electrode side.

FIG. 9 illustrates the results confirming the amount of a difference that is preferably set between the number of electrode fingers in each of the narrower-pitch portions 22c and 32c and the number of electrode fingers in each of the narrower-pitch portions 22d and 32d. In other words, FIG. 9 is a graph representing the relationship between a difference between the number of electrode fingers in each of the narrower-pitch portions 22c, 32c and the number of electrode fingers in each of the narrower-pitch portions 22d, 32d with respect to the magnitude of the attenuation pole caused due to the 1st-order resonation mode, when impedance is set to about 1 Ω.

In order to improve the sharpness of the filter characteristics in the transient band on the lower frequency side than the pass band, the magnitude of the attenuation pole is set to be at least about 5 dB. As shown in FIG. 9, the difference between the number of electrode fingers in each of the narrower-pitch portions 22c and 32c and the number of electrode fingers in each of the narrower-pitch portions 22d and 32d must be at least two in order to increase the magnitude of the attenuation pole to at least about 5 dB. From this result, it is understood that the difference between the number of electrode fingers in each of the narrower-pitch portion 22c, 32c and the number of electrode fingers in each of the narrower-pitch portion 22d, 32d is preferably set to be at least two.

An optimum range of the difference between the period P1 and the period P4, which is preferable in order to minimize the magnitude of the spike ripple generated within the pass band, differs depending on the difference between the number of electrode fingers in each of the narrower-pitch portions 22c and 32c and the number of electrode fingers in each of the narrower-pitch portions 22d and 32d. Therefore, the difference between the period P1 and the period P4, which is preferable in order to minimize the magnitude of the spike ripple generated within the pass band, cannot be simply specified.

The first preferred embodiment has been described above in connection with the case in which the periods of the electrode fingers in the narrower-pitch portions 22c, 32c, 22d and 32d are constant. However, the periods of the electrode fingers in the narrower-pitch portions 22c, 32c, 22d and 32d are not always required to be constant. For example, the periods of the electrode fingers in the narrower-pitch portions 22c, 32c, 22d and 32d may be gradually changed, as disclosed in Japanese Unexamined Patent Application Publication No. 2002-528987. Further, each of the narrower-pitch portions 22c, 32c, 22d and 32d may include a plurality of portions in which pitches of the electrode fingers differ from each other, as disclosed in Japanese Unexamined Patent Application Publication (Translation of PCT Application) No. 2003-243965. When the periods of the electrode fingers in the narrower-pitch portions 22c, 32c, 22d and 32d are not constant as mentioned above, the spike ripple positioned within the pass band can be prevented by setting respective average values of the periods of the electrode fingers in the narrower-pitch portions 22c, 32c, 22d and 32d as in the first preferred embodiment.

More specifically, when the number of electrode fingers in each of the narrower-pitch portions 22c and 32c is less than the number of electrode fingers in each of the narrower-pitch portions 22d and 32d, the spike ripple in the pass band is minimized or prevented, as in the first preferred embodiment, preferably by setting the average value of the periods of the electrode fingers in each of the narrower-pitch portions 21c and 31c to be less than the average value of the periods of the electrode fingers in each of the narrower-pitch portions 23c and 33c.

The first preferred embodiment has been described above in connection with the case in which the bilateral asymmetry is achieved preferably by setting the number of electrode fingers in the narrower-pitch portion 22c and the number of electrode fingers in the narrower-pitch portion 22d to be different from each other. In addition, the bilateral asymmetry can also be achieved, for example, by setting the number of electrode fingers in the portion of the first IDT electrode other than the narrower-pitch portion thereof and the number of electrode fingers in the portion of the third IDT electrode other than the narrower-pitch portion thereof to be different from each other.

As a reference example, an elastic wave filter device was fabricated by modifying the first longitudinally-coupled resonator-type elastic wave filter section 20 in the first example such that the number of electrode fingers in the narrower-pitch portions 22c was set to be equal to the number of electrode fingers in the narrower-pitch portion 22d, whereas the number of electrode fingers in the portion of the first IDT electrode 21 other than the narrower-pitch portion 21c thereof was reduced by four and the number of electrode fingers in the portion of the third IDT electrode 23 other than the narrower-pitch portion 23c thereof was increased by four. The insertion loss of the fabricated elastic wave filter device according to the reference example was then measured. In addition, as a comparative example, an elastic wave filter device was fabricated in which the number of electrode fingers in the narrower-pitch portions 22c was set to be equal to the number of electrode fingers in the narrower-pitch portion 22d, and the number of electrode fingers in the portion of the first IDT electrode 21 other than the narrower-pitch portion 21c thereof was also set to be equal to the number of electrode fingers in the portion of the third IDT electrode 23 other than the narrower-pitch portion 23c. The insertion loss of the fabricated elastic wave filter device according to the comparative example was then measured. The measured results are illustrated in FIG. 10. In FIG. 10, a solid line indicates the insertion loss of the elastic wave filter device according to the reference example, and a dotted line indicates the insertion loss of the elastic wave filter device according to the comparative example.

As seen from the results illustrated in FIG. 10, when the number of electrode fingers in the portion of the first IDT electrode other than the narrower-pitch portion thereof and the number of electrode fingers in the portion of the third IDT electrode other than the narrower-pitch portion thereof are set to be different from each other, a large ripple (attenuation pole) was not observed in the vicinity of about 1.92 GHz. In other words, the attenuation pole corresponding to the 1st-order resonance mode was not observed. From this result, it is understood that the sharpness of the filter characteristics in the transient band cannot be improved by setting the number of electrode fingers in the portion of the first IDT electrode other than the narrower-pitch portion thereof and the number of electrode fingers in the portion of the third IDT electrode other than the narrower-pitch portion thereof to be different from each other, and that, in order to improve the sharpness of the filter characteristics in the transient band, the bilateral asymmetry must be achieved by setting the numbers of the electrode fingers in the narrower-pitch portions to be different from each other.

While the first preferred embodiment has been described above in connection with the elastic wave filter device which is used as the UMTS-band2 reception filter, the elastic wave filter device according to preferred embodiments of the present invention can also be used in applications other than the UMTS-band2 reception filter. The elastic wave filter device according to preferred embodiments of the present invention can be suitably used as a filter in, e.g., an RF stage and an IF stage of a portable communication terminal. Further, the elastic wave filter device according to preferred embodiments of the present invention may not include balance-unbalance conversion function.

Second Preferred Embodiment

A second preferred embodiment of the present invention is described in connection with an elastic wave filter device having substantially the same construction as that of the elastic wave filter device 1 according to the first preferred embodiment, except for the construction of the narrower-pitch portions 21c, 31c, 22c, 32c, 22d, 32d, 23c and 33c. In the following description of the second preferred embodiment, members having substantially the same functions as those in the first preferred embodiment are denoted by common symbols and descriptions thereof are not repeated. In addition, FIG. 1 is further referred to in the following description.

Figure 11:
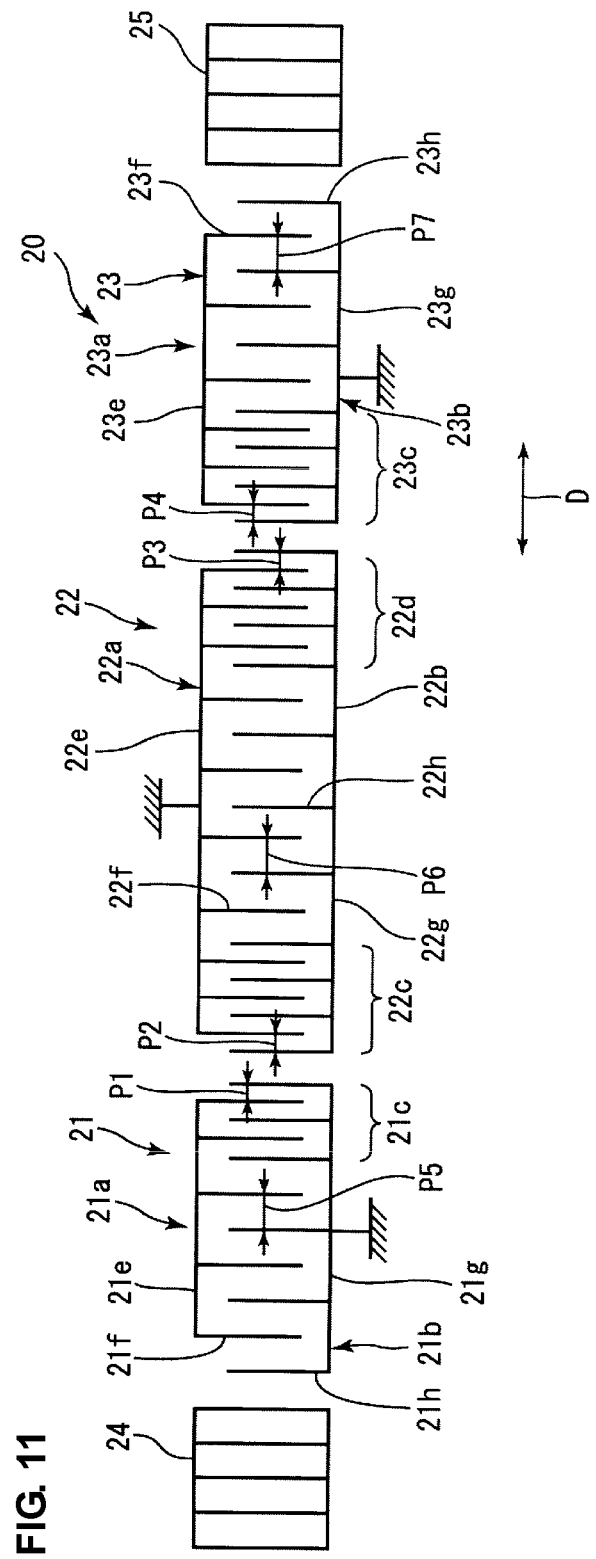
FIG. 11 is a simplified view illustrating the construction of a first longitudinally-coupled resonator-type elastic wave filter section in a second preferred embodiment of the present invention.
Figure 12:
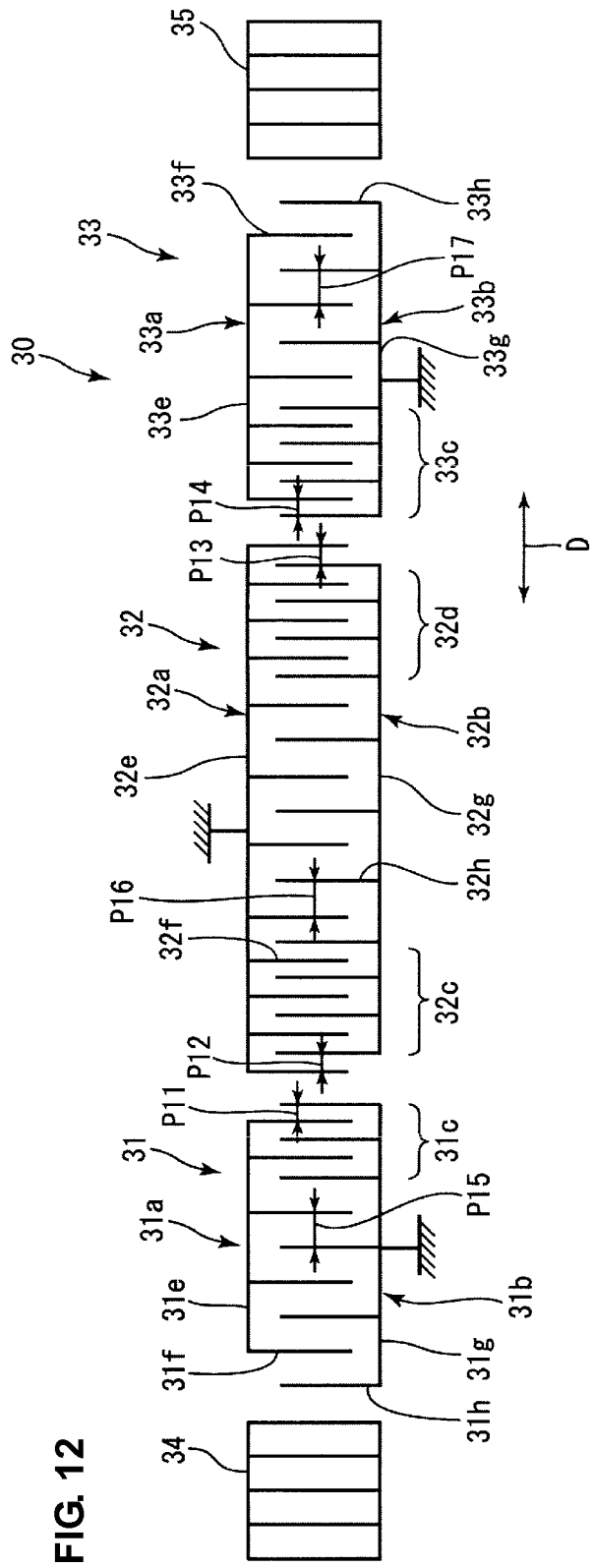
FIG. 12 is a simplified view illustrating the construction of a second longitudinally-coupled resonator-type elastic wave filter section in the second preferred embodiment of the present invention.

FIG. 11 is a simplified view illustrating the construction of a first longitudinally-coupled resonator-type elastic wave filter section 20 in the second preferred embodiment. FIG. 12 is a simplified view illustrating the construction of a second longitudinally-coupled resonator-type elastic wave filter section 30 in the second preferred embodiment. As illustrated in FIGS. 11 and 12, the second preferred embodiment differs from the first preferred embodiment in that the number of electrode fingers in each of the narrower-pitch portions 22c and 32c on the first IDT electrode side and the number of electrode fingers in each of the narrower-pitch portions 22d and 32d on the third IDT electrode side are preferably set to be equal to each other. On the other hand, the number of electrode fingers in each of the narrower-pitch portions 21c and 31c of the first IDT electrodes 21 and 31 and the number of electrode fingers in each of the narrower-pitch portions 23c and 33c of the third IDT electrodes 23 and 33 are preferably set to be different from each other. More specifically, the number of electrode fingers in each of the narrower-pitch portions 21c and 31c is preferably set to be less than the number of electrode fingers in each of the narrower-pitch portions 23c and 33c.

In the second preferred embodiment, the 1st-order resonance mode is generated in the first and second longitudinally-coupled resonator-type elastic wave filter sections 20, 30. In this preferred embodiment, the narrower-pitch portions 21c, 31c, 22c, 32c, 22d, 32d, 23c and 33c are configured such that an attenuation pole (i.e., a peak in a frequency characteristic) caused due to the 1st-order resonance mode is positioned within a transient band of each of the first and second longitudinally-coupled resonator-type elastic wave filter sections 20, 30. Accordingly, the sharpness of the filter characteristics in the transient band is improved as in the first preferred embodiment.

When the number of electrode fingers in each of the narrower-pitch portions 21c and 31c of the first IDT electrodes 21 and 31 and the number of electrode fingers in each of the narrower-pitch portions 23c and 33c of the third IDT electrodes 23 and 33 differ from each other as in the second preferred embodiment, a spike ripple caused due to the generation of the 1st-order resonance mode tends to be generated within a pass band.

To compensate for such a tendency, in the second preferred embodiment, the period P2 of the electrode fingers in each of the narrower-pitch portions 22c and 32c on the first IDT electrode side of the second IDT electrodes 22 and 32 and the period P3 of the electrode fingers in each of the narrower-pitch portions 22d and 32d on the third IDT electrode side of the second IDT electrodes 22 and 32 are preferably set to be different from each other. More specifically, the period P2 is preferably set to be less than the period P3. This setting makes it possible to minimize or prevent the spike ripple that is caused within the pass band due to the generation of the 1st-order resonance mode in each of the first and second longitudinally-coupled resonator-type elastic wave filter sections 20, 30.

That is, since the number of electrode fingers in each of the narrower-pitch portions 21c and 31c of the first IDT electrodes 21 and 31 is preferably set to be less than the number of electrode fingers in each of the narrower-pitch portions 23c and 33c of the third IDT electrodes 23 and 33 and the period P2 is preferably set to be less than the period P3, the sharpness of the filter characteristics in the transient band is improved and the spike ripple in the pass band is minimized or prevented at the same time.

To further improve the sharpness of the filter characteristics, it is preferable to increase the difference between the number of electrode fingers in each of the narrower-pitch portions 21c and 31c of the first IDT electrodes 21 and 31 and the number of electrode fingers in each of the narrower-pitch portions 23c and 33c of the third IDT electrodes 23 and 33.

Sixth and Seventh Examples

As a sixth example, the first longitudinally-coupled resonator-type elastic wave filter section 20 in the second preferred embodiment was fabricated based on the following design parameters and the insertion loss thereof was measured.

Crossing width: about 30.4λ (λ: wavelength determined depending on the period of the IDT electrode=about 2.0118 μm)

Number of electrode fingers in the first IDT electrode 21: 37

Number of electrode fingers in the third IDT electrode 23: 41

Number of electrode fingers in the narrower-pitch portion 21c: 3

Number of electrode fingers in the narrower-pitch portion 23c: 7

Periods P1 and P4 of respective electrode fingers in the narrower-pitch portions 21c and 23c: about 1.9220 μm Number of electrode fingers in the second IDT electrode 22: 43

Number of electrode fingers in each of the narrower-pitch portions 22c an 22d: 4

Period P2 of the electrode fingers in the narrower-pitch portion 22c on the first IDT electrode side: about 1.8269 μm Period P3 of the electrode fingers in the narrower-pitch portion 22d on the third IDT electrode side: about 1.8269 μm (equal to the period of the electrode fingers in the narrower-pitch portion 22c on the first IDT electrode side)

Number of electrode fingers in each of the first and second grating reflectors 24, 25, 34 and 35: 65

Metallization ratio: about 0.68

Electrode film thickness: about 0.091λ

Also, as a seventh example, a first longitudinally-coupled resonator-type elastic wave filter section 20 was fabricated so as to differ from the sixth example only in the number of electrode fingers in each of the narrower-pitch portions 21c and 23c. The insertion loss of the fabricated longitudinally-coupled resonator-type elastic wave filter section was then measured. More specifically, in the seventh example, the number of electrode fingers in the narrower-pitch portion 21c was set to four and the number of electrode fingers in the narrower-pitch portion 23c was set to six.

Further, as a second comparative example, a first longitudinally-coupled resonator-type elastic wave filter section was fabricated based on the same design parameters as those in the sixth example except for that the number of electrode fingers in each of the narrower-pitch portions 21c and 23c was set to five. The insertion loss of the fabricated longitudinally-coupled resonator-type elastic wave filter section was then measured.

Figure 13:
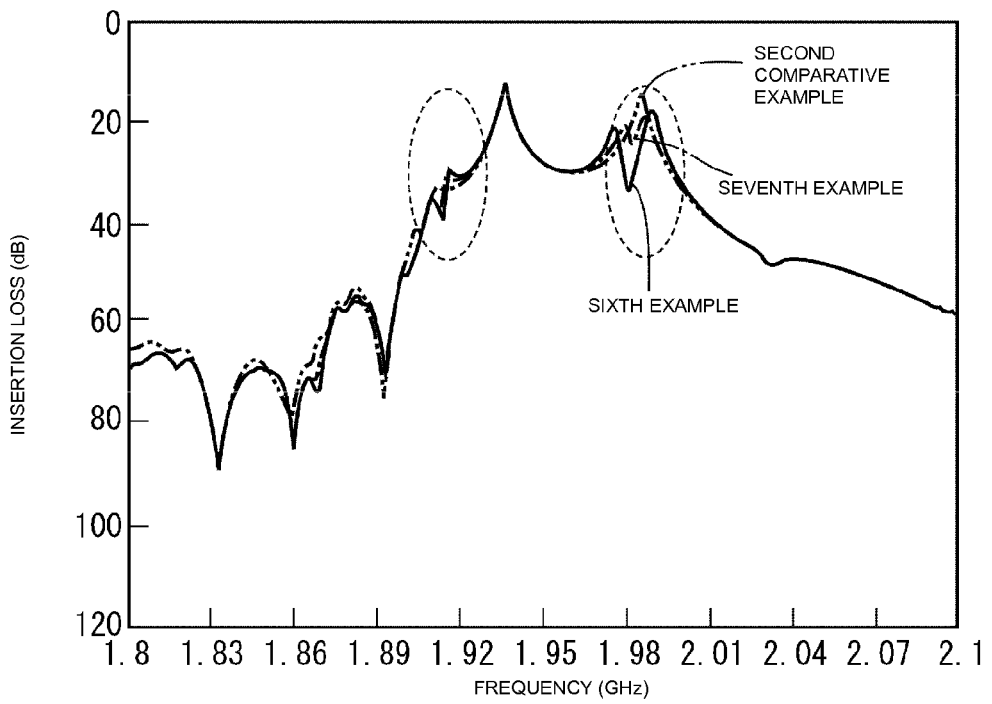
FIG. 13 is a graph representing the insertion losses of respective first longitudinally-coupled resonator-type elastic wave filter sections in sixth and seventh examples and a second comparative example.

FIG. 13 illustrates the insertion losses of respective first longitudinally-coupled resonator-type elastic wave filter sections in the sixth and seventh examples and in the second comparative example. In FIG. 13, a solid line indicates the insertion loss of the first longitudinally-coupled resonator-type elastic wave filter section in the sixth example, a one-dot-chain line indicates the insertion loss of the first longitudinally-coupled resonator-type elastic wave filter section in the seventh example, and a two-dot-chain line indicates the insertion loss of the first longitudinally-coupled resonator-type elastic wave filter section in the second comparative example.

As illustrated in FIG. 13, an attenuation pole caused due to the 1st-order resonance mode was observed in the vicinity of a frequency of about 1.92 GHz in the sixth and seventh examples in which the number of electrode fingers in the narrower-pitch portion 21c differs from the number of electrode fingers in the narrower-pitch portion 23c. Further, in the sixth example in which the difference between the number of electrode fingers in the narrower-pitch portion 21c and the number of electrode fingers in the narrower-pitch portion 23c is four, the attenuation pole had a larger magnitude than in the seventh example in which the difference between the number of electrode fingers in the narrower-pitch portion 21c and the number of electrode fingers in the narrower-pitch portion 23c is two. From these results, it is understood that, by setting the difference between the number of electrode fingers in the narrower-pitch portion 21c and the number of electrode fingers in the narrower-pitch portion 23c to a larger value, the magnitude of the attenuation pole caused due to the 1st-order resonation mode is increased and, therefore, the sharpness of the filter characteristics in the transient band is further improved.

A spike ripple was observed in the vicinity of a frequency of about 1.98 GHz in the sixth and seventh examples in which the number of electrode fingers in the narrower-pitch portion 21c differs from the number of electrode fingers in the narrower-pitch portion 23c. Further, in the sixth example in which the difference between the number of electrode fingers in the narrower-pitch portion 21c and the number of electrode fingers in the narrower-pitch portion 23c is four, a larger spike ripple was observed as compared to the seventh example in which the difference between the number of electrode fingers in the narrower-pitch portion 21c and the number of electrode fingers in the narrower-pitch portion 23c is two.

Eighth and Ninth Examples

As eighth and ninth examples, first longitudinally-coupled resonator-type elastic wave filter sections were fabricated based on the same design parameters as those in the above-described sixth example, except for the difference between the period P2 of the electrode fingers in the narrower-pitch portion 22c on the first IDT electrode side and the period P3 of the electrode fingers in the narrower-pitch portion 22d on the third IDT electrode side. More specifically, in the eighth example, the period P2 of the electrode fingers in the narrower-pitch portion 22c on the first IDT electrode side was set to be less than the period P3 of the electrode fingers in the narrower-pitch portion 22d on the third IDT electrode side by about 0.04 μm. In the ninth example, the period P2 of the electrode fingers in the narrower-pitch portion 22c on the first IDT electrode side was set to be less than the period P3 of the electrode fingers in the narrower-pitch portion 22d on the third IDT electrode side by about 0.02 μm.

Figure 14:
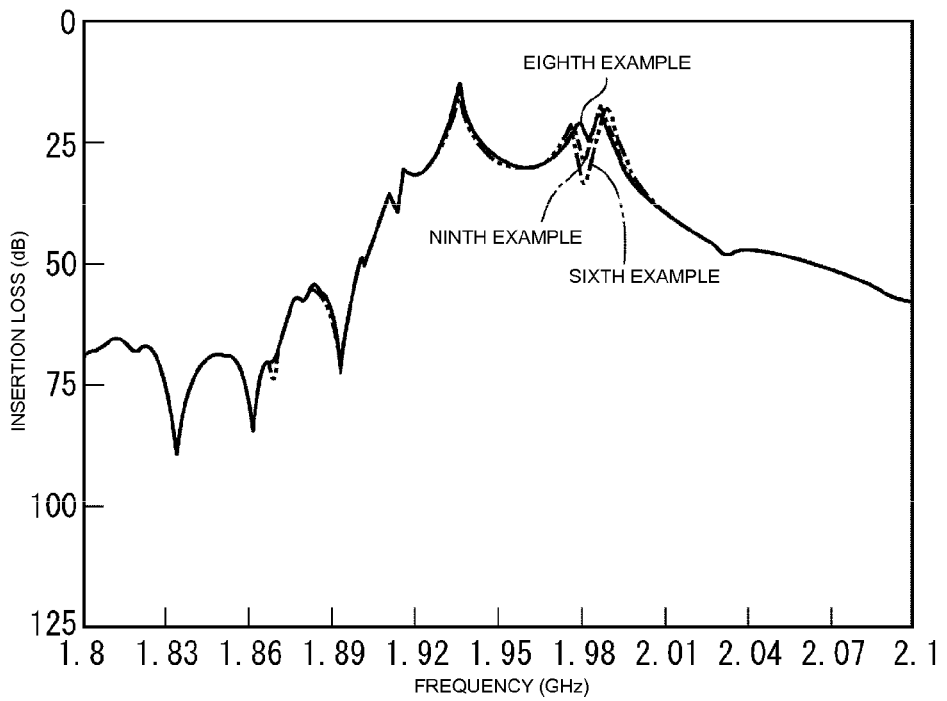
FIG. 14 is a graph representing the insertion losses of respective first longitudinally-coupled resonator-type elastic wave filter sections in eighth and ninth examples and the sixth example.

The insertion losses of respective first longitudinally-coupled resonator-type elastic wave filter sections in the eighth and ninth examples were measured. The measured results are illustrated in FIG. 14. In FIG. 14, a solid line indicates the insertion loss of the first longitudinally-coupled resonator-type elastic wave filter section in the eighth example, a one-dot-chain line indicates the insertion loss of the first longitudinally-coupled resonator-type elastic wave filter section in the ninth example, and a two-dot-chain line indicates the insertion loss of the first longitudinally-coupled resonator-type elastic wave filter section in the sixth example.

As illustrated in FIG. 14, in the eighth example in which the period P2 of the electrode fingers in the narrower-pitch portion 22c on the first IDT electrode side is less than the period P3 of the electrode fingers in the narrower-pitch portion 22d on the third IDT electrode side by about 0.04 μm, a smaller spike ripple was observed as compared to the ninth example in which the period P2 is less than the period P3 by about 0.02 μm. From this result, it is understood that the spike ripple in the pass band can be reduced by increasing the difference between the period P2 of the electrode fingers in the narrower-pitch portion 22c on the first IDT electrode side and the period P3 of the electrode fingers in the narrower-pitch portion 22d on the third IDT electrode side.

Figure 15:
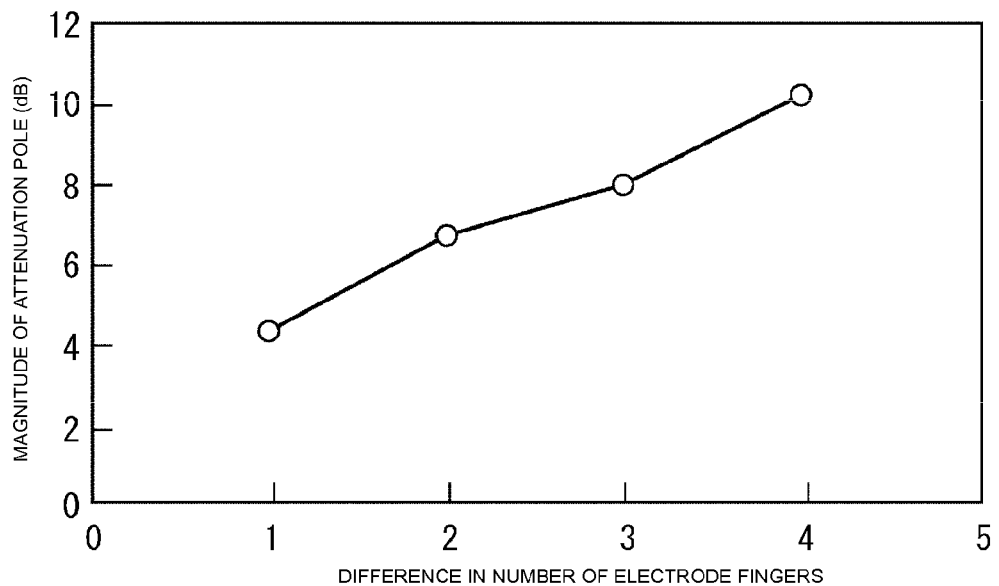
FIG. 15 is a graph representing the relation of a difference between the number of electrode fingers in each of narrower-pitch portions and the number of electrode fingers in each of narrower-pitch portions with respect to the magnitude of an attenuation pole caused due to the 1st-order resonation mode, when impedance is set to about 1 Ω.

FIG. 15 illustrates results in order to confirm the amount of difference that is preferable to set between the number of electrode fingers in each of the narrower-pitch portions 21c and 31c and the number of electrode fingers in each of the narrower-pitch portions 23c and 33c. In other words, FIG. 15 is a graph representing the relationship of a difference between the number of electrode fingers in each of the narrower-pitch portions 21c, 31c and the number of electrode fingers in each of the narrower-pitch portions 23c, 33c with respect to the magnitude of the attenuation pole caused due to the 1st-order resonation mode, when impedance is set to about 1Ω.

In order to improve the sharpness of the filter characteristics in the transient band on the lower frequency side than the pass band, the magnitude of the attenuation pole is preferably set to be at least about 5 dB. As shown in FIG. 15, the difference between the number of electrode fingers in each of the narrower-pitch portions 21c and 31c and the number of electrode fingers in each of the narrower-pitch portions 23c and 33c must be at least two in order to increase the magnitude of the attenuation pole to about 5 dB or more. From this result, it is understood that the difference between the number of electrode fingers in each of the narrower-pitch portion 21c, 31c and the number of electrode fingers in each of the narrower-pitch portion 23c, 33c is preferably set to be at least two.

An optimum range of the difference between the period P2 and the period P3, which is preferable in order to reduce the magnitude of the spike ripple generated within the pass band, differs depending on the difference between the number of electrode fingers in each of the narrower-pitch portions 21c and 31c and the number of electrode fingers in each of the narrower-pitch portions 23c and 33c. Therefore, the difference between the period P2 and the period P3, which is preferable in order to reduce the magnitude of the spike ripple generated within the pass band, cannot be simply specified.

The second preferred embodiment has been described above in connection with the case in which the periods of the electrode fingers in the narrower-pitch portions 21c, 31c, 23c and 33c are constant. However, the periods of the electrode fingers in the narrower-pitch portions 21c, 31c, 23c and 33c are not always required to be constant. For example, the periods of the electrode fingers in the narrower-pitch portions 21c, 31c, 23c and 33c may be gradually changed. Further, each of the narrower-pitch portions 21c, 31c, 23c and 33c may preferably include a plurality of portions in which pitches of the electrode fingers differ from one another. When the periods of the electrode fingers in the narrower-pitch portions 21c, 31c, 23c and 33c are not constant as mentioned above, the spike ripple positioned within the pass band can be minimized or prevented by setting respective average values of the periods of the electrode fingers in the narrower-pitch portions 21c, 31c, 23c and 33c as in the second preferred embodiment.

More specifically, when the number of electrode fingers in each of the narrower-pitch portions 21c and 31c is less than the number of electrode fingers in each of the narrower-pitch portions 23c and 33c, the spike ripple in the pass band is minimized or prevented, as in the second preferred embodiment, by setting the average value of the periods of the electrode fingers in each of the narrower-pitch portions 21c and 31c to be less than the average value of the periods of the electrode fingers in each of the narrower-pitch portions 23c and 33c.

Tenth Example

As a tenth example, an elastic wave filter device having the same design parameters as those in the first preferred embodiment, except for the following parameters was fabricated and the insertion loss thereof was measured.

First and second longitudinally-coupled resonator-type elastic wave filter sections 20, 30:

Crossing width: about 32.9λ (λ: wavelength determined depending on the period of the IDT electrode=about 2.0412 μm)

Number of electrode fingers in each of the first IDT electrodes 21 and 31: 38

Number of electrode fingers in each of the narrower-pitch portions 21c and 31c: 3

Number of electrode fingers in each of the second IDT electrodes 22 and 32: 43

Number of electrode fingers in each of the narrower-pitch portions 22c and 32c on the first IDT electrode side: 3

Number of electrode fingers in each of the narrower-pitch portions 22d and 32d on the third IDT electrode side: 7

Number of electrode fingers in each of the third IDT electrodes 23 and 33: 42

Number of electrode fingers in each of the narrower-pitch portions 23c and 33c: 7

Periods P1 and P11 of respective electrode fingers in the narrower-pitch portions 21c and 31c: about 1.9560 μm (about 0.085 μm less than the period of the electrode fingers in each of the narrower-pitch portion 23c and 33c)

Periods P4 and P14 of the electrode fingers in the narrower-pitch portions 23c and 33c: about 2.0410 μm Periods P2 and P12 of respective electrode fingers in the narrower-pitch portions 22c and 32c on the first IDT electrode side: about 1.7461 μm (about 0.087 μm less than the period of the electrode fingers in each of the narrower-pitch portion 22d and 32d on the third IDT electrode side)

Figure 16:
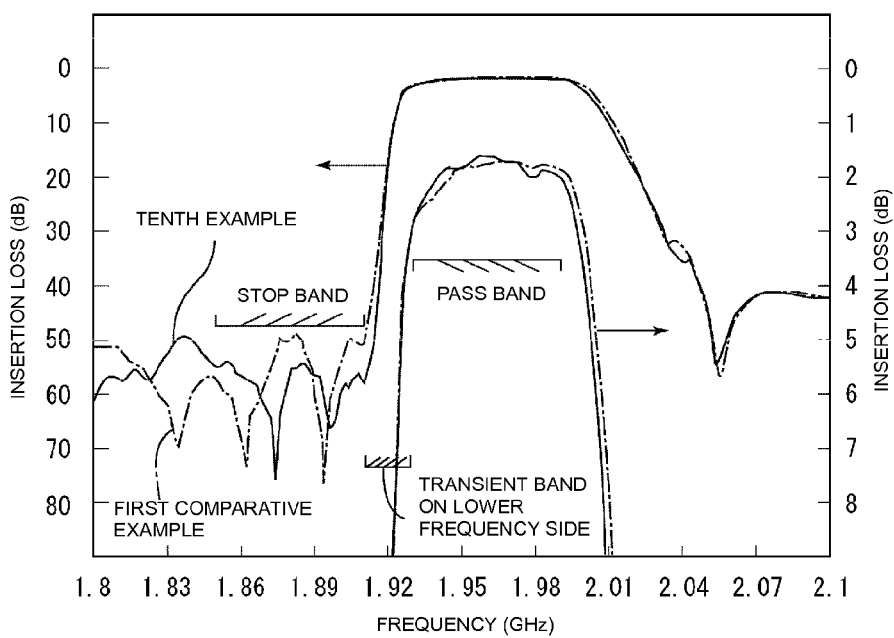
FIG. 16 is a graph representing the insertion losses of respective elastic wave filter devices in a tenth example and the first comparative example.
Figure 17:
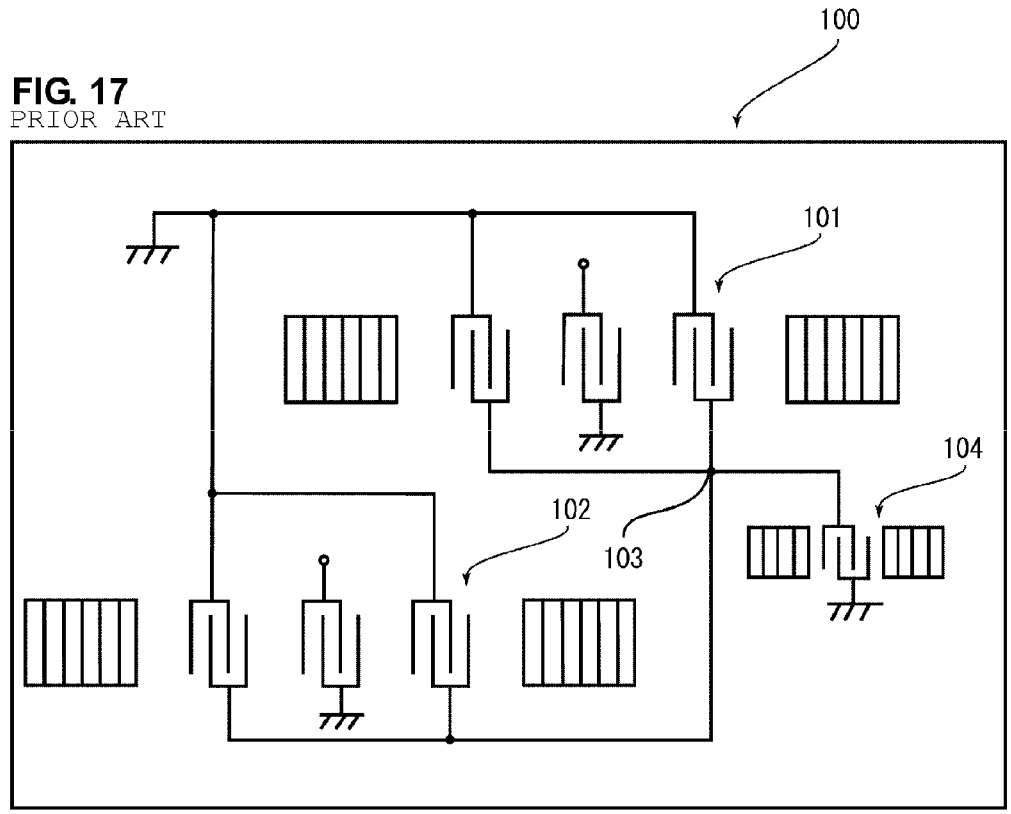
FIG. 17 illustrates the construction of a longitudinally-coupled resonator-type elastic wave filter device of the related art.

Periods P3 and P13 of the electrode fingers in the narrower-pitch portions 22d and 32d on the third IDT electrode side: about 1.8331 μm FIG. 16 illustrates the insertion loss of the elastic wave filter device in the tenth example along with the insertion loss of the elastic wave filter device in the above-described first comparative example. In FIG. 16, a solid line indicates the insertion loss of the elastic wave filter device in the tenth example, and a one-dot-chain line indicates the insertion loss of the elastic wave filter device in the first comparative example.

As illustrated in FIG. 16, in the tenth example in which each of the narrower-pitch portions 22c and 32c on the first IDT electrode side has a smaller number of electrode fingers and a smaller period of the electrode fingers than each of the narrower-pitch portions 22d and 32d on the third IDT electrode side and in which each of the narrower-pitch portions 21c and 31c has a smaller number of electrode fingers and a smaller period of the electrode fingers than each of the narrower-pitch portions 23c and 33c, increased sharpness of the filter characteristics in the transient band on the lower frequency side is obtained as compared to the first comparative example. More specifically, in the transient band on the lower frequency side, an interval from the frequency at which the insertion loss is about 3.5 dB to the frequency at which the insertion loss is about 47 dB is reduced in the tenth example by about 3.7 MHz as compared to the first comparative example. Further, in the tenth example, a large spike ripple was not observed in the pass band.

From such a result, it can be understood that when each of the narrower-pitch portions 22c and 32c on the first IDT electrode side has a smaller number of electrode fingers and a smaller period of the electrode fingers than each of the narrower-pitch portions 22d and 32d on the third IDT electrode side and each of the narrower-pitch portions 21c and 31c has a smaller number of electrode fingers and a smaller period of the electrode fingers than each of the narrower-pitch portions 23c and 33c, a satisfactory frequency characteristic in the pass band and an increased sharpness of the filter characteristics in the transient band are simultaneously obtained.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An elastic wave filter device comprising:
a piezoelectric substrate; and
a longitudinally-coupled resonator-type elastic wave filter section including first to third IDT electrodes, which are successively arranged on the piezoelectric substrate in a direction of propagation of elastic waves and each of which includes a plurality of electrode fingers, and first and second reflectors arranged on the piezoelectric substrate respectively on both sides of a region in which the first to third IDT electrodes are disposed, as viewed in the direction of propagation of the elastic waves; wherein
each of the first to third IDT electrodes includes a narrower-pitch portion provided in an end portion thereof, which is adjacent to another one of the first to third IDT electrodes in the direction of propagation of the elastic waves, the narrower-pitch portion having a smaller period of electrode fingers than a period of electrode fingers in a remaining portion of the respective one of the first to third IDT electrodes;
a number of electrode fingers in the narrower-pitch portion of the second IDT electrode, which is disposed on a side closer to the first IDT electrode, and a number of electrode fingers in the narrower-pitch portion of the second IDT electrode, which is disposed on a side closer to the third IDT electrode, differ from each other; and
the narrower-pitch portions of the first to third IDT electrodes are arranged such that a frequency of an attenuation pole generated due to a 1st-order resonance mode of the longitudinally-coupled resonator-type elastic wave filter section is located within a transient band which is positioned between a pass band and a stop band of the longitudinally-coupled resonator-type elastic wave filter section.

2. The elastic wave filter device according to claim 1, wherein the number of electrode fingers in the narrower-pitch portion of the second IDT electrode, which is disposed on the side closer to the first IDT electrode, and the number of electrode fingers in the narrower-pitch portion of the second IDT electrode, which is disposed on the side closer to the third IDT electrode, differ by at least two from each other.

3. The elastic wave filter device according to claim 1, wherein a period of the electrode fingers in the narrower-pitch portion of the first IDT electrode and a period of the electrode fingers in the narrower-pitch portion of the third IDT electrode differ from each other.

4. The elastic wave filter device according to claim 3, wherein
the number of electrode fingers in the narrower-pitch portion of the second IDT electrode, which is disposed on the side closer to the first IDT electrode, is less than the number of electrode fingers in the narrower-pitch portion of the second IDT electrode, which is disposed on the side closer to the third IDT electrode; and
the period of the electrode fingers in the narrower-pitch portion of the first IDT electrode is less than the period of the electrode fingers in the narrower-pitch portion of the third IDT electrode.

5. The elastic wave filter device according to claim 3, wherein
the number of electrode fingers in the narrower-pitch portion of the second IDT electrode, which is disposed on the side closer to the first IDT electrode, is less than the number of electrode fingers in the narrower-pitch portion of the second IDT electrode, which is disposed on the side closer to the third IDT electrode;
at least one of the period of the electrode fingers in the narrower-pitch portion of the first IDT electrode and the period of the electrode fingers in the narrower-pitch portion of the third IDT electrode is not constant; and
an average value of the periods of the electrode fingers in the narrower-pitch portion of the first IDT electrode is smaller than an average value of the periods of the electrode fingers in the narrower-pitch portion of the third IDT electrode.

6. The elastic wave filter device according to claim 1, wherein the number of electrode fingers in the narrower-pitch portion of the first IDT electrode and the number of electrode fingers in the narrower-pitch portion of the third IDT electrode differ from each other.

7. An elastic wave filter device comprising:
a piezoelectric substrate; and
a longitudinally-coupled resonator-type elastic wave filter section including first to third IDT electrodes, which are successively arranged on the piezoelectric substrate in a direction of propagation of elastic waves and each of which includes a plurality of electrode fingers, and first and second reflectors arranged on the piezoelectric substrate respectively on both sides of a region in which the first to third IDT electrodes are disposed, as viewed in the direction of propagation of the elastic waves; wherein
each of the first to third IDT electrodes includes a narrower-pitch portion provided in an end portion thereof, which is adjacent to another one of the first to third IDT electrodes in the direction of propagation of the elastic waves, the narrower-pitch portion having a smaller period of electrode fingers than a period of electrode fingers in a remaining portion of the respective one of the first to third IDT electrodes;
a number of electrode fingers in the narrower-pitch portion of the first IDT electrode and a number of electrode fingers in the narrower-pitch portion of the third IDT electrode differ from each other; and
the narrower-pitch portions of the first to third IDT electrodes are arranged such that a frequency of an attenuation pole caused due to a 1st-order resonance mode of the longitudinally-coupled resonator-type elastic wave filter section is located within a transient band which is positioned between a pass band and a stop band of the longitudinally-coupled resonator-type elastic wave filter section.

8. The elastic wave filter device according to claim 7, wherein the number of electrode fingers in the narrower-pitch portion of the first IDT electrode and the number of electrode fingers in the narrower-pitch portion of the third IDT electrode differ by at least two from each other.

9. The elastic wave filter device according to claim 7, wherein a period of the electrode fingers in the narrower-pitch portion of the second IDT electrode, which is disposed on a side closer to the first IDT electrode, and a period of the electrode fingers in the narrower-pitch portion of the second IDT electrode, which is disposed on a side closer to the third IDT electrode, differ from each other.

10. The elastic wave filter device according to claim 9, wherein
the number of electrode fingers in the narrower-pitch portion of the first IDT electrode is less than the number of electrode fingers in the narrower-pitch portion of the third IDT electrode; and
the period of the electrode fingers in the narrower-pitch portion of the second IDT electrode, which is disposed on the side closer to the first IDT electrode, is less than the period of the electrode fingers in the narrower-pitch portion of the second IDT electrode, which is disposed on the side closer to the third IDT electrode.

11. The elastic wave filter device according to claim 9, wherein
the number of electrode fingers in the narrower-pitch portion of the first IDT electrode is less than the number of electrode fingers in the narrower-pitch portion of the third IDT electrode;
at least one of the period of the electrode fingers in the narrower-pitch portion of the second IDT electrode, which is disposed on the side closer to the first IDT electrode, and the period of the electrode fingers in the narrower-pitch portion of the second IDT electrode, which is disposed on the side closer to the third IDT electrode, is not constant; and
an average value of the periods of the electrode fingers in the narrower-pitch portion of the second IDT electrode, which is disposed on the side closer to the first IDT electrode, is less than an average value of the periods of the electrode fingers in the narrower-pitch portion of the second IDT electrode, which is disposed on the side closer to the third IDT electrode.

* * * * *